(12) United States Patent
Hartung et al.

(10) Patent No.: US 10,582,322 B2
(45) Date of Patent: *Mar. 3, 2020

(54) AUDIO PLAYBACK SETTINGS FOR VOICE INTERACTION

(71) Applicant: Sonos, Inc., Santa Barbara, CA (US)

(72) Inventors: Klaus Hartung, Santa Barbara, CA (US); Romi Kadri, Cambridge, MA (US)

(73) Assignee: Sonos, Inc., Santa Barbara, CA (US)

( * ) Notice: Subject to any disclaimer, the term of this patent is extended or adjusted under 35 U.S.C. 154(b) by 15 days.

This patent is subject to a terminal disclaimer.

(21) Appl. No.: 15/946,585

(22) Filed: Apr. 5, 2018

(65) Prior Publication Data

US 2018/0332417 A1   Nov. 15, 2018

Related U.S. Application Data

(63) Continuation of application No. 15/277,810, filed on Sep. 27, 2016, now Pat. No. 9,942,678.

(51) Int. Cl.
*H04R 29/00* (2006.01)
*G06F 3/16* (2006.01)
(Continued)

(52) U.S. Cl.
CPC ............ *H04R 29/007* (2013.01); *G06F 3/165* (2013.01); *H04R 27/00* (2013.01); *G10L 25/84* (2013.01);
(Continued)

(58) Field of Classification Search
CPC ................. H04R 29/007; H04R 27/00; H04R 2227/003; H04R 2227/005; G06F 3/165; G10L 25/84
(Continued)

(56) References Cited

U.S. PATENT DOCUMENTS 4,741,038 A   4/1988 Elko et al.
4,941,187 A   7/1990 Slater
(Continued)

FOREIGN PATENT DOCUMENTS

AU   2017100486 A4   6/2017
AU   2017100581 A4   6/2017
(Continued)

OTHER PUBLICATIONS

US 9,299,346 B1, 03/2016, Hart et al. (withdrawn)
(Continued)

*Primary Examiner* — Quynh H Nguyen
(74) *Attorney, Agent, or Firm* — McDonnell Boehnen Hulbert & Berghoff LLP

(57) ABSTRACT

Example techniques relate to voice interaction in an environment with a media playback system that is playing back audio content. In an example implementation, while playing back first audio in a given environment at a given loudness: a playback device (a) detects that an event is anticipated in the given environment, the event involving playback of second audio and (b) determines a loudness of background noise in the given environment, the background noise comprising ambient noise in the given environment. The playback device ducks the first audio in proportion to a difference between the given loudness of the first audio and the determined loudness of the background noise and plays back the ducked first audio concurrently with the second audio.

20 Claims, 10 Drawing Sheets

(51) Int. Cl.
*H04R 27/00* (2006.01)
*G10L 25/84* (2013.01)

(52) U.S. Cl.
CPC .. *H04R 2227/003* (2013.01); *H04R 2227/005* (2013.01); *H04R 2420/07* (2013.01); *H04R 2430/01* (2013.01)

(58) Field of Classification Search
USPC .......................................................... 381/110
See application file for complete search history.

(56) References Cited

U.S. PATENT DOCUMENTS

| | | |
|---|---|---|
| 5,440,644 A | 8/1995 | Farinelli et al. |
| 5,740,260 A | 4/1998 | Odom |
| 5,761,320 A | 6/1998 | Farinelli et al. |
| 5,923,902 A | 7/1999 | Inagaki |
| 6,032,202 A | 2/2000 | Lea et al. |
| 6,256,554 B1 | 7/2001 | DiLorenzo |
| 6,301,603 B1 | 10/2001 | Maher et al. |
| 6,311,157 B1 | 10/2001 | Strong |
| 6,404,811 B1 | 6/2002 | Cvetko et al. |
| 6,469,633 B1 | 10/2002 | Wachter |
| 6,522,886 B1 | 2/2003 | Youngs et al. |
| 6,594,347 B1 | 7/2003 | Calder et al. |
| 6,611,537 B1 | 8/2003 | Edens et al. |
| 6,631,410 B1 | 10/2003 | Kowalski et al. |
| 6,757,517 B2 | 6/2004 | Chang |
| 6,778,869 B2 | 8/2004 | Champion |
| 7,130,608 B2 | 10/2006 | Hollstrom et al. |
| 7,130,616 B2 | 10/2006 | Janik |
| 7,143,939 B2 | 12/2006 | Henzerling |
| 7,236,773 B2 | 6/2007 | Thomas |
| 7,295,548 B2 | 11/2007 | Blank et al. |
| 7,391,791 B2 | 6/2008 | Balassanian et al. |
| 7,483,538 B2 | 1/2009 | McCarty et al. |
| 7,571,014 B1 | 8/2009 | Lambourne et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,661,107 B1 | 2/2010 | Van Dyke et al. |
| 7,702,508 B2 | 4/2010 | Bennett |
| 7,792,311 B1 | 9/2010 | Holmgren et al. |
| 7,853,341 B2 | 12/2010 | McCarty et al. |
| 7,987,294 B2 | 7/2011 | Bryce et al. |
| 8,014,423 B2 | 9/2011 | Thaler et al. |
| 8,041,565 B1 | 10/2011 | Bhardwaj et al. |
| 8,045,952 B2 | 10/2011 | Qureshey et al. |
| 8,073,125 B2 | 12/2011 | Zhang et al. |
| 8,103,009 B2 | 1/2012 | McCarty et al. |
| 8,234,395 B2 | 7/2012 | Millington et al. |
| 8,239,206 B1 | 8/2012 | Lebeau et al. |
| 8,255,224 B2 | 8/2012 | Singleton et al. |
| 8,290,603 B1 | 10/2012 | Lambourne |
| 8,364,481 B2 | 1/2013 | Strope et al. |
| 8,386,261 B2 | 2/2013 | Mellott et al. |
| 8,423,893 B2 | 4/2013 | Ramsay et al. |
| 8,428,758 B2 | 4/2013 | Naik et al. |
| 8,453,058 B1 | 5/2013 | Coccaro et al. |
| 8,483,853 B1 | 7/2013 | Lambourne |
| 8,484,025 B1 | 7/2013 | Moreno Mengibar et al. |
| 8,831,761 B2 | 9/2014 | Kemp et al. |
| 8,831,957 B2 | 9/2014 | Taubman et al. |
| 8,938,394 B1 | 1/2015 | Faaborg et al. |
| 8,942,252 B2 | 1/2015 | Balassanian et al. |
| 8,983,383 B1 | 3/2015 | Haskin |
| 8,983,844 B1 | 3/2015 | Thomas et al. |
| 9,042,556 B2 | 5/2015 | Kallai et al. |
| 9,094,539 B1 | 7/2015 | Noble |
| 9,215,545 B2 | 12/2015 | Dublin et al. |
| 9,251,793 B2 | 2/2016 | Lebeau et al. |
| 9,253,572 B2 | 2/2016 | Beddingfield, Sr. et al. |
| 9,262,612 B2 | 2/2016 | Cheyer |
| 9,288,597 B2 | 3/2016 | Carlsson et al. |
| 9,300,266 B2 | 3/2016 | Grokop |
| 9,318,107 B1 | 4/2016 | Sharifi |
| 9,319,816 B1 | 4/2016 | Narayanan |
| 9,412,392 B2 | 8/2016 | Lindahl et al. |
| 9,426,567 B2 | 8/2016 | Lee et al. |
| 9,431,021 B1 | 8/2016 | Scalise et al. |
| 9,443,527 B1 | 9/2016 | Watanabe et al. |
| 9,472,201 B1 | 10/2016 | Sleator |
| 9,472,203 B1 | 10/2016 | Ayrapetian et al. |
| 9,484,030 B1 | 11/2016 | Meaney et al. |
| 9,489,948 B1 | 11/2016 | Chu et al. |
| 9,494,683 B1 | 11/2016 | Sadek |
| 9,509,269 B1 | 11/2016 | Rosenberg |
| 9,514,752 B2 | 12/2016 | Sharifi |
| 9,536,541 B2 | 1/2017 | Chen et al. |
| 9,548,066 B2 | 1/2017 | Jain et al. |
| 9,552,816 B2 | 1/2017 | Vanlund et al. |
| 9,560,441 B1 | 1/2017 | McDonough, Jr. et al. |
| 9,601,116 B2 | 3/2017 | Melendo Casado et al. |
| 9,615,170 B2 | 4/2017 | Kirsch et al. |
| 9,615,171 B1 | 4/2017 | O'Neill et al. |
| 9,632,748 B2 | 4/2017 | Faaborg et al. |
| 9,633,186 B2 | 4/2017 | Ingrassia, Jr. et al. |
| 9,633,368 B2 | 4/2017 | Greenzeiger et al. |
| 9,633,660 B2 | 4/2017 | Haughay et al. |
| 9,633,671 B2 | 4/2017 | Giacobello et al. |
| 9,633,674 B2 | 4/2017 | Sinha et al. |
| 9,640,179 B1 | 5/2017 | Hart et al. |
| 9,640,183 B2 | 5/2017 | Jung et al. |
| 9,641,919 B1 | 5/2017 | Poole et al. |
| 9,646,614 B2 | 5/2017 | Bellegarda et al. |
| 9,653,060 B1 | 5/2017 | Hilmes et al. |
| 9,653,075 B1 | 5/2017 | Chen et al. |
| 9,659,555 B1 | 5/2017 | Hilmes et al. |
| 9,672,821 B2 | 6/2017 | Krishnaswamy et al. |
| 9,685,171 B1 | 6/2017 | Yang |
| 9,691,378 B1 | 6/2017 | Meyers et al. |
| 9,691,379 B1 | 6/2017 | Mathias et al. |
| 9,697,826 B2 | 7/2017 | Sainath et al. |
| 9,697,828 B1 | 7/2017 | Prasad et al. |
| 9,698,999 B2 | 7/2017 | Mutagi et al. |
| 9,704,478 B1 | 7/2017 | Vitaladevuni et al. |
| 9,721,568 B1 | 8/2017 | Polansky et al. |
| 9,721,570 B1 | 8/2017 | Beal et al. |
| 9,728,188 B1 | 8/2017 | Rosen et al. |
| 9,734,822 B1 | 8/2017 | Sundaram et al. |
| 9,747,011 B2 | 8/2017 | Lewis et al. |
| 9,747,899 B2 | 8/2017 | Pogue et al. |
| 9,747,920 B2 | 8/2017 | Ayrapetian et al. |
| 9,747,926 B2 | 8/2017 | Sharifi et al. |
| 9,754,605 B1 | 9/2017 | Chhetri |
| 9,762,967 B2 | 9/2017 | Clarke et al. |
| 9,811,314 B2 | 11/2017 | Plagge et al. |
| 9,813,810 B1 | 11/2017 | Nongpiur |
| 9,820,036 B1 | 11/2017 | Tritschler et al. |
| 9,820,039 B2 | 11/2017 | Lang |
| 9,826,306 B2 | 11/2017 | Lang |
| 9,881,616 B2 | 1/2018 | Beckley et al. |
| 2001/0042107 A1 | 11/2001 | Palm |
| 2002/0022453 A1 | 2/2002 | Balog et al. |
| 2002/0026442 A1 | 2/2002 | Lipscomb et al. |
| 2002/0034280 A1 | 3/2002 | Infosino |
| 2002/0072816 A1 | 6/2002 | Shdema et al. |
| 2002/0124097 A1 | 9/2002 | Isely et al. |
| 2003/0040908 A1 | 2/2003 | Yang et al. |
| 2003/0072462 A1 | 4/2003 | Hlibowicki |
| 2003/0157951 A1 | 8/2003 | Hasty |
| 2004/0024478 A1 | 2/2004 | Hans et al. |
| 2005/0164664 A1 | 7/2005 | DiFonzo et al. |
| 2005/0195988 A1 | 9/2005 | Tashev et al. |
| 2005/0268234 A1 | 12/2005 | Rossi et al. |
| 2005/0283330 A1 | 12/2005 | Laraia et al. |
| 2006/0147058 A1 | 7/2006 | Wang |
| 2006/0190968 A1 | 8/2006 | Jung et al. |
| 2006/0247913 A1 | 11/2006 | Huerta et al. |
| 2006/0262943 A1 | 11/2006 | Oxford |
| 2007/0018844 A1 | 1/2007 | Sutardja |
| 2007/0019815 A1 | 1/2007 | Asada et al. |
| 2007/0033043 A1 | 2/2007 | Hyakumoto |
| 2007/0071255 A1 | 3/2007 | Schobben |

(56) References Cited

U.S. PATENT DOCUMENTS

| | | |
|---|---|---|
| 2007/0076131 A1 | 4/2007 | Li et al. |
| 2007/0140058 A1 | 6/2007 | McIntosh et al. |
| 2007/0142944 A1 | 6/2007 | Goldberg et al. |
| 2008/0090537 A1 | 4/2008 | Sutardja |
| 2008/0248797 A1 | 10/2008 | Freeman et al. |
| 2008/0301729 A1 | 12/2008 | Broos et al. |
| 2009/0003620 A1 | 1/2009 | McKillop et al. |
| 2009/0005893 A1 | 1/2009 | Sugii et al. |
| 2009/0018828 A1 | 1/2009 | Nakadai et al. |
| 2009/0076821 A1 | 3/2009 | Brenner et al. |
| 2009/0197524 A1 | 8/2009 | Haff et al. |
| 2009/0228919 A1 | 9/2009 | Zott et al. |
| 2009/0238377 A1 | 9/2009 | Ramakrishnan et al. |
| 2009/0326949 A1 | 12/2009 | Douthitt et al. |
| 2010/0014690 A1 | 1/2010 | Wolff et al. |
| 2010/0023638 A1 | 1/2010 | Bowman |
| 2010/0075723 A1 | 3/2010 | Min et al. |
| 2010/0179874 A1 | 7/2010 | Higgins et al. |
| 2010/0211199 A1 | 8/2010 | Naik et al. |
| 2011/0033059 A1 | 2/2011 | Bhaskar et al. |
| 2011/0091055 A1 | 4/2011 | Leblanc |
| 2011/0145581 A1 | 6/2011 | Malhotra et al. |
| 2011/0267985 A1 | 11/2011 | Wilkinson et al. |
| 2011/0276333 A1 | 11/2011 | Wang et al. |
| 2011/0280422 A1 | 11/2011 | Neumeyer et al. |
| 2011/0299706 A1 | 12/2011 | Sakai |
| 2012/0131125 A1 | 5/2012 | Seidel et al. |
| 2012/0148075 A1 | 6/2012 | Goh et al. |
| 2012/0163603 A1 | 6/2012 | Abe et al. |
| 2012/0177215 A1 | 7/2012 | Bose et al. |
| 2012/0297284 A1 | 11/2012 | Matthews, III et al. |
| 2013/0006453 A1 | 1/2013 | Wang et al. |
| 2013/0024018 A1 | 1/2013 | Chang et al. |
| 2013/0058492 A1 | 3/2013 | Silzle et al. |
| 2013/0066453 A1 | 3/2013 | Seefeldt |
| 2013/0148821 A1 | 6/2013 | Sorensen |
| 2013/0179173 A1 | 7/2013 | Lee et al. |
| 2013/0183944 A1 | 7/2013 | Mozer et al. |
| 2013/0191122 A1 | 7/2013 | Mason |
| 2013/0216056 A1 | 8/2013 | Thyssen |
| 2013/0317635 A1 | 11/2013 | Bates et al. |
| 2013/0329896 A1 | 12/2013 | Krishnaswamy et al. |
| 2013/0331970 A1 | 12/2013 | Beckhardt et al. |
| 2013/0332165 A1 | 12/2013 | Beckley et al. |
| 2013/0343567 A1 | 12/2013 | Triplett et al. |
| 2014/0003611 A1 | 1/2014 | Mohammad et al. |
| 2014/0003635 A1 | 1/2014 | Mohammad et al. |
| 2014/0006026 A1 | 1/2014 | Lamb et al. |
| 2014/0064501 A1 | 3/2014 | Olsen et al. |
| 2014/0075306 A1 | 3/2014 | Rega |
| 2014/0094151 A1 | 4/2014 | Klappert et al. |
| 2014/0100854 A1 | 4/2014 | Chen et al. |
| 2014/0167931 A1 | 6/2014 | Lee et al. |
| 2014/0195252 A1 | 7/2014 | Gruber et al. |
| 2014/0244013 A1 | 8/2014 | Reilly |
| 2014/0258292 A1 | 9/2014 | Thramann et al. |
| 2014/0270282 A1 | 9/2014 | Tammi et al. |
| 2014/0274185 A1 | 9/2014 | Luna et al. |
| 2014/0277650 A1 | 9/2014 | Zurek et al. |
| 2014/0363022 A1 | 12/2014 | Dizon et al. |
| 2015/0010169 A1 | 1/2015 | Popova et al. |
| 2015/0016642 A1 | 1/2015 | Walsh et al. |
| 2015/0063580 A1 | 3/2015 | Huang et al. |
| 2015/0086034 A1 | 3/2015 | Lombardi et al. |
| 2015/0104037 A1 | 4/2015 | Lee et al. |
| 2015/0154976 A1 | 6/2015 | Mutagi |
| 2015/0180432 A1 | 6/2015 | Gao et al. |
| 2015/0189438 A1 | 7/2015 | Hampiholi et al. |
| 2015/0200454 A1 | 7/2015 | Heusdens et al. |
| 2015/0222987 A1 | 8/2015 | Angel, Jr. et al. |
| 2015/0228274 A1 | 8/2015 | Leppänen et al. |
| 2015/0253292 A1 | 9/2015 | Larkin et al. |
| 2015/0253960 A1 | 9/2015 | Lin et al. |
| 2015/0271593 A1 | 9/2015 | Sun et al. |
| 2015/0280676 A1 | 10/2015 | Holman et al. |
| 2015/0296299 A1 | 10/2015 | Klippel et al. |
| 2015/0302856 A1 | 10/2015 | Kim et al. |
| 2015/0341406 A1 | 11/2015 | Rockefeller et al. |
| 2015/0363061 A1 | 12/2015 | De Nigris, III et al. |
| 2015/0363401 A1 | 12/2015 | Chen et al. |
| 2015/0371657 A1 | 12/2015 | Gao et al. |
| 2015/0380010 A1 | 12/2015 | Srinivasan |
| 2016/0007116 A1 | 1/2016 | Holman |
| 2016/0021458 A1 | 1/2016 | Johnson et al. |
| 2016/0029142 A1 | 1/2016 | Isaac et al. |
| 2016/0036962 A1 | 2/2016 | Rand et al. |
| 2016/0042748 A1 | 2/2016 | Jain et al. |
| 2016/0057522 A1 | 2/2016 | Choisel et al. |
| 2016/0077710 A1 | 3/2016 | Lewis et al. |
| 2016/0088392 A1 | 3/2016 | Huttunen et al. |
| 2016/0093304 A1 | 3/2016 | Kim et al. |
| 2016/0098393 A1 | 4/2016 | Hebert |
| 2016/0157035 A1 | 6/2016 | Russell et al. |
| 2016/0173578 A1 | 6/2016 | Sharma et al. |
| 2016/0212538 A1 | 7/2016 | Fullam et al. |
| 2016/0225385 A1 | 8/2016 | Hammarqvist |
| 2016/0232451 A1 | 8/2016 | Scherzer |
| 2016/0234204 A1 | 8/2016 | Rishi et al. |
| 2016/0239255 A1 | 8/2016 | Chavez et al. |
| 2016/0260431 A1 | 9/2016 | Newendorp et al. |
| 2016/0314782 A1 | 10/2016 | Klimanis |
| 2016/0352915 A1 | 12/2016 | Gautama |
| 2016/0353218 A1 | 12/2016 | Starobin et al. |
| 2017/0003931 A1 | 1/2017 | Dvortsov et al. |
| 2017/0026769 A1 | 1/2017 | Patel |
| 2017/0060526 A1 | 3/2017 | Barton et al. |
| 2017/0070478 A1 | 3/2017 | Park et al. |
| 2017/0076720 A1 | 3/2017 | Gopalan et al. |
| 2017/0078824 A1 | 3/2017 | Heo |
| 2017/0084292 A1 | 3/2017 | Yoo |
| 2017/0090864 A1 | 3/2017 | Jorgovanovic |
| 2017/0092278 A1 | 3/2017 | Evermann et al. |
| 2017/0092297 A1 | 3/2017 | Sainath et al. |
| 2017/0103755 A1 | 4/2017 | Jeon et al. |
| 2017/0125037 A1 | 5/2017 | Shin |
| 2017/0177585 A1 | 6/2017 | Rodger et al. |
| 2017/0178662 A1 | 6/2017 | Ayrapetian et al. |
| 2017/0193999 A1 | 7/2017 | Aleksic et al. |
| 2017/0206896 A1 | 7/2017 | Ko et al. |
| 2017/0214996 A1 | 7/2017 | Yeo |
| 2017/0236512 A1 | 8/2017 | Williams et al. |
| 2017/0242651 A1 | 8/2017 | Lang et al. |
| 2017/0242653 A1 | 8/2017 | Lang et al. |
| 2017/0270919 A1 | 9/2017 | Parthasarathi et al. |
| 2017/0353789 A1 | 12/2017 | Kim et al. |
| 2018/0033428 A1 | 2/2018 | Kim et al. |

FOREIGN PATENT DOCUMENTS

| | | |
|---|---|---|
| EP | 1349146 A1 | 10/2003 |
| EP | 1389853 A1 | 2/2004 |
| EP | 2351021 B1 | 9/2017 |
| JP | 2001236093 A | 8/2001 |
| JP | 2004347943 A | 12/2004 |
| JP | 2004354721 A | 12/2004 |
| JP | 2005284492 A | 10/2005 |
| JP | 2008079256 A | 4/2008 |
| JP | 2008158868 A | 7/2008 |
| JP | 2010141748 A | 6/2010 |
| JP | 2013037148 A | 2/2013 |
| JP | 2014071138 A | 4/2014 |
| JP | 2014137590 A | 7/2014 |
| KR | 20100111071 A | 10/2010 |
| WO | 200153994 | 7/2001 |
| WO | 2003093950 A2 | 11/2003 |
| WO | 2015037396 A1 | 3/2015 |
| WO | 2015178950 A1 | 11/2015 |
| WO | 2016033364 A1 | 3/2016 |
| WO | 2017039632 A1 | 3/2017 |

OTHER PUBLICATIONS

Non-Final Office Action dated Feb. 6, 2018, issued in connection with U.S. Appl. No. 15/237,133, filed Aug. 15, 2016, 6 pages.

(56) References Cited

OTHER PUBLICATIONS

Non-Final Office Action dated Sep. 6, 2017, issued in connection with U.S. Appl. No. 15/131,254, filed Apr. 18, 2016, 13 pages.
Non-Final Office Action dated Apr. 9, 2018, issued in connection with U.S. Appl. No. 15/804,776, filed Nov. 6, 2017, 18 pages.
Non-Final Office Action dated May 9, 2018, issued in connection with U.S. Appl. No. 15/818,051, filed Nov. 20, 2017, 22 pages.
Notice of Allowance dated Dec. 4, 2017, issued in connection with U.S. Appl. No. 15/277,810, filed Sep. 27, 2016, 5 pages.
Notice of Allowance dated Jul. 5, 2018, issued in connection with U.S. Appl. No. 15/237,133, filed Aug. 15, 2016, 5 pages.
Notice of Allowance dated Jul. 9, 2018, issued in connection with U.S. Appl. No. 15/438,741, filed Feb. 21, 2017, 5 pages.
Notice of Allowance dated Apr. 11, 2018, issued in connection with U.S. Appl. No. 15/719,454, filed Sep. 28, 2017, 15 pages.
Notice of Allowance dated Jul. 12, 2017, issued in connection with U.S. Appl. No. 15/098,805, filed Apr. 14, 2016, 8 pages.
Notice of Allowance dated Dec. 13, 2017, issued in connection with U.S. Appl. No. 15/784,952, filed Oct. 16, 2017, 9 pages.
Notice of Allowance dated Aug. 14, 2017, issued in connection with U.S. Appl. No. 15/098,867, filed Apr. 14, 2016, 10 pages.
Notice of Allowance dated Feb. 14, 2017, issued in connection with U.S. Appl. No. 15/229,855, filed Aug. 5, 2016, 11 pages.
Notice of Allowance dated Jun. 14, 2017, issued in connection with U.S. Appl. No. 15/282,554, filed Sep. 30, 2016, 11 pages.
Notice of Allowance dated Dec. 15, 2017, issued in connection with U.S. Appl. No. 15/223,218, filed Jul. 29, 2016, 7 pages.
Notice of Allowance dated Aug. 16, 2017, issued in connection with U.S. Appl. No. 15/098,892, filed Apr. 14, 2016, 9 pages.
Notice of Allowance dated Aug. 17, 2017, issued in connection with U.S. Appl. No. 15/131,244, filed Apr. 18, 2016, 9 pages.
Notice of Allowance dated Jul. 19, 2018, issued in connection with U.S. Appl. No. 15/681,937, filed Aug. 21, 2017, 7 pages.
Notice of Allowance dated Mar. 20, 2018, issued in connection with U.S. Appl. No. 15/784,952, filed Oct. 16, 2017, 7 pages.
Notice of Allowance dated Aug. 22, 2017, issued in connection with U.S. Appl. No. 15/273,679, filed Sep. 22, 2016, 5 pages.
Notice of Allowance dated Jan. 22, 2018, issued in connection with U.S. Appl. No. 15/178,180, filed Jun. 9, 2016, 9 pages.
Notice of Allowance dated Dec. 29, 2017, issued in connection with U.S. Appl. No. 15/131,776, filed Apr. 18, 2016, 13 pages.
Notice of Allowance dated Jul. 30, 2018, issued in connection with U.S. Appl. No. 15/098,718, filed Apr. 14, 2016, 5 pages.
Notice of Allowance dated Mar. 9, 2018, issued in connection with U.S. Appl. No. 15/584,782, filed May 2, 2017, 8 pages.
Palm, Inc., "Handbook for the Palm VII Handheld," May 2000, 311 pages.
Presentations at WinHEC 2000, May 2000, 138 pages.
Tsiami et al. "Experiments in acoustic source localization using sparse arrays in adverse indoors environments", 2014 22nd European Signal Processing Conference, Sep. 1, 2014, 5 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Vacher at al. "Recognition of voice commands by multisource ASR and noise cancellation in a smart home environment" Signal Processing Conference 2012 Proceedings of the 20th European, IEEE, Aug. 27, 2012, 5 pages.
Xiao et al. "A Learning-Based Approach to Direction of Arrival Estimation in Noisy and Reverberant Environments," 2015 IEEE International Conference on Acoustics, Speech and Signal Processing, Apr. 19, 2015, 5 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Non-Final Office Action dated Feb. 8, 2017, issued in connection with U.S. Appl. No. 15/098,892, filed Apr. 14, 2016, 17 pages.
Non-Final Office Action dated Mar. 9, 2017, issued in connection with U.S. Appl. No. 15/098,760, filed Apr. 14, 2016, 13 pages.
Non-Final Office Action dated Jan. 10, 2018, issued in connection with U.S. Appl. No. 15/098,718, filed Apr. 14, 2016, 15 pages.
Non-Final Office Action dated Jan. 10, 2018, issued in connection with U.S. Appl. No. 15/229,868, filed Aug. 5, 2016, 13 pages.
Non-Final Office Action dated Jan. 10, 2018, issued in connection with U.S. Appl. No. 15/438,725, filed Feb. 21, 2017, 15 pages.
Non-Final Office Action dated Dec. 12, 2016, issued in connection with U.S. Appl. No. 15/098,718, filed Apr. 14, 2016, 11 pages.
Non-Final Office Action dated Jan. 13, 2017, issued in connection with U.S. Appl. No. 15/098,805, filed Apr. 14, 2016, 11 pages.
Non-Final Office Action dated Sep. 14, 2017, issued in connection with U.S. Appl. No. 15/178,180, filed Jun. 9, 2016, 16 pages.
Non-Final Office Action dated Mar. 16, 2018, issued in connection with U.S. Appl. No. 15/681,937, filed Aug. 21, 2017, 5 pages.
Non-Final Office Action dated Apr. 18, 2018, issued in connection with U.S. Appl. No. 15/811,468, filed Nov. 13, 2017, 14 pages.
Non-Final Office Action dated Apr. 19, 2017, issued in connection with U.S. Appl. No. 15/131,776, filed Apr. 18, 2016, 12 pages.
Non-Final Office Action dated Feb. 20, 2018, issued in connection with U.S. Appl. No. 15/211,748, filed Jul. 15, 2016, 31 pages.
Non-Final Office Action dated May 22, 2018, issued in connection with U.S. Appl. No. 15/946,599, filed Apr. 5, 2018, 19 pages.
Non-Final Office Action dated Jul. 25, 2017, issued in connection with U.S. Appl. No. 15/273,679, filed Jul. 22, 2016, 11 pages.
Non-Final Office Action dated Jan. 26, 2017, issued in connection with U.S. Appl. No. 15/098,867, filed Apr. 14, 2016, 16 pages.
Non-Final Office Action dated Oct. 26, 2017, issued in connection with U.S. Appl. No. 15/438,744, filed Feb. 21, 2017, 12 pages.
Non-Final Office Action dated Jun. 27, 2018, issued in connection with U.S. Appl. No. 15/438,749, filed Feb. 21, 2017, 16 pages.
Non-Final Office Action dated Jun. 30, 2017, issued in connection with U.S. Appl. No. 15/277,810, filed Sep. 27, 2016, 13 pages.
Non-Final Office Action dated Feb. 6, 2018, issued in connection with U.S. Appl. No. 15/211,689, filed Jul. 15, 2016, 32 pages.
Advisory Action dated Jun. 28, 2018, issued in connection with U.S. Appl. No. 15/438,744, filed Feb. 21, 2017, 3 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Corrected Notice of Allowability dated Mar. 8, 2017, issued in connection with U.S. Appl. No. 15/229,855, filed Aug. 5, 2016, 6 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Extended Search Report dated Oct. 30, 2017, issued in connection with EP Application No. 17174435.2, 11 pages.
Final Office Action dated Oct. 6, 2017, issued in connection with U.S. Appl. No. 15/098,760, filed Apr. 14, 2016, 25 pages.
Final Office Action dated Aug. 11, 2017, issued in connection with U.S. Appl. No. 15/131,776, filed Apr. 18, 2016, 7 pages.
Final Office Action dated Apr. 13, 2018, issued in connection with U.S. Appl. No. 15/131,254, filed Apr. 18, 2016, 18 pages.
Final Office Action dated Apr. 13, 2018, issued in connection with U.S. Appl. No. 15/438,744, filed Feb. 21, 2017, 20 pages.
Final Office Action dated Jun. 15, 2017, issued in connection with U.S. Appl. No. 15/098,718, filed Apr. 14, 2016, 15 pages.
Fiorenza Arisio et al. "Deliverable 1.1 User Study, analysis of requirements and definition of the application task," May 31, 2012, http://dirha.fbk.eu/sites/dirha.fbk.eu/files/docs/DIRHA_D1.1., 31 pages.

(56) References Cited

OTHER PUBLICATIONS

Freiberger, Karl, "Development and Evaluation of Source Localization Algorithms for Coincident Microphone Arrays," Diploma Thesis, Apr. 1, 2010, 106 pages.
International Searching Authority, International Search Report and Written Opinion dated Nov. 22, 2017, issued in connection with International Application No. PCT/US2017/054063, filed on Sep. 28, 2017, 11 pages.
International Searching Authority, International Search Report and Written Opinion dated May 23, 2017, issued in connection with International Application No. PCT/US2017/018739, Filed on Feb. 21, 2017, 10 pages.
International Searching Authority, International Search Report and Written Opinion dated Oct. 23, 2017, issued in connection with International Application No. PCT/US2017/042170, filed on Jul. 14, 2017, 15 pages.
International Searching Authority, International Search Report and Written Opinion dated Oct. 24, 2017, issued in connection with International Application No. PCT/US2017/042227, filed on Jul. 14, 2017, 16 pages.
International Searching Authority, International Search Report and Written Opinion dated May 30, 2017, issued in connection with International Application No. PCT/US2017/018728, Filed on Feb. 21, 2017, 11 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Morales-Cordovilla et al. "Room Localization for Distant Speech Recognition," Proceedings of Interspeech 2014, Sep. 14, 2014, 4 pages.
Non-Final Office Action dated Jun. 1, 2017, issued in connection with U.S. Appl. No. 15/223,218, filed Jul. 29, 2016, 7 pages.
Non-Final Office Action dated Nov. 2, 2017, issued in connection with U.S. Appl. No. 15/584,782, filed May 2, 2017, 11 pages.
Non-Final Office Action dated Nov. 3, 2017, issued in connection with U.S. Appl. No. 15/438,741, filed Feb. 21, 2017, 11 pages.
Non-Final Office Action dated Feb. 7, 2017, issued in connection with U.S. Appl. No. 15/131,244, filed Apr. 18, 2016, 12 pages.

AUDIO PLAYBACK SETTINGS FOR VOICE INTERACTION

CROSS REFERENCE TO RELATED APPLICATIONS

This application claims priority under 35 U.S.C. § 120 to, and is a continuation of, U.S. patent application Ser. No. 15/277,810, filed on Sep. 27, 2016, entitled "Audio Playback Settings for Voice Interaction," the contents of which are incorporated by reference herein in their entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
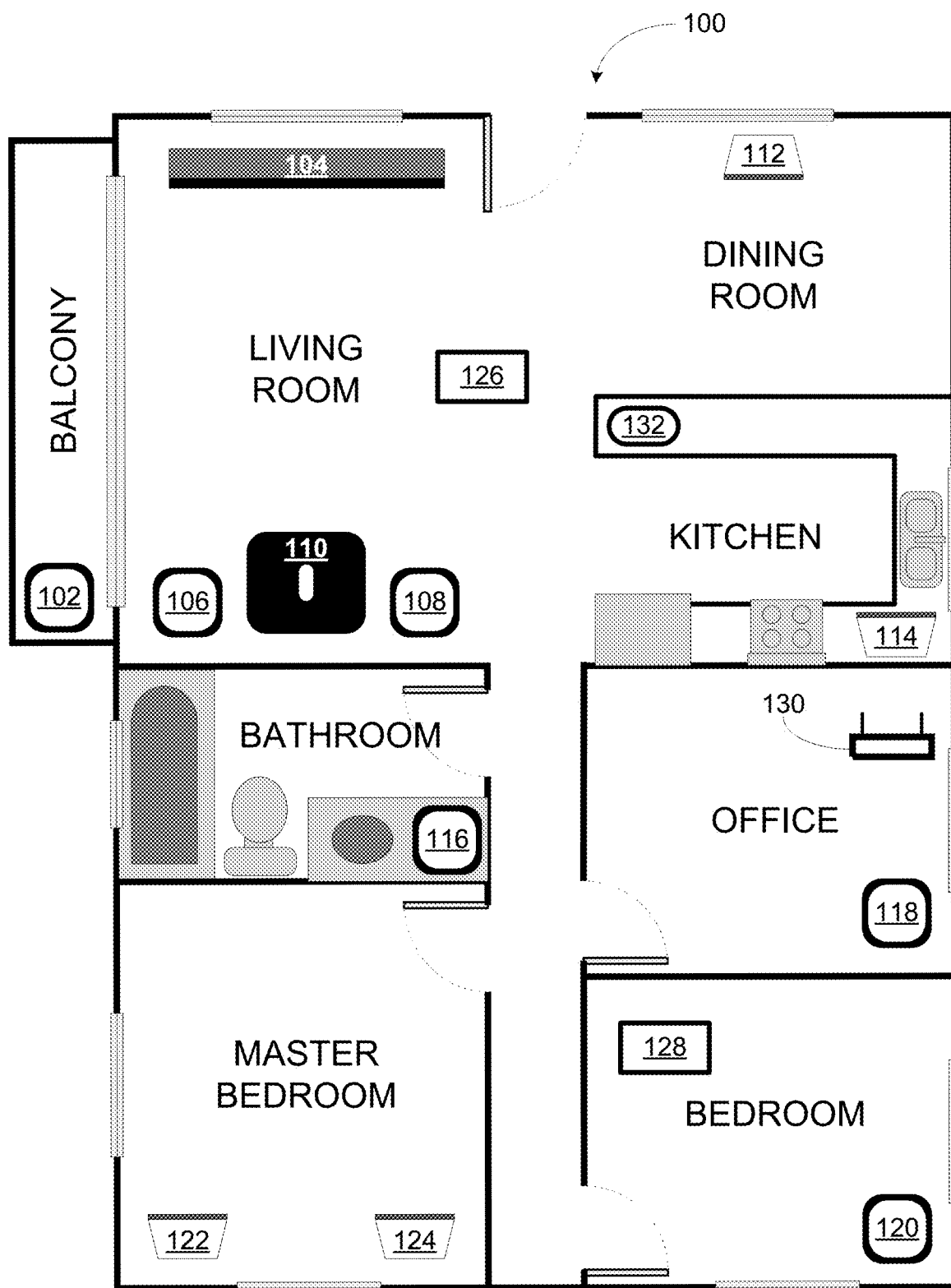
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Ambient noise may interfere with conversation between people. For instance, two people engaged in conversation in a crowded room may have difficulty understanding one another over ambient noise from other people in the room as well as other sources of sound (e.g., music or other audio content from an audio playback system). When spoken words are clearly audible over ambient noise, those spoken words can be considered to have a "good" signal-to-noise ratio (i.e., "good" enough for comprehension during a conversation).

Some voice services (e.g., Amazon® ALEXA®, Microsoft® CORTANA®, and Apple® SIRI®, among others now commercially available or that become available in the future) may use spoken words as input for voice control, search, and other operations. A networked microphone device (e.g., a wireless speaker, a smartphone, tablet, laptop computer, or other device) may include a microphone for detecting voice inputs and a network interface for querying a voice service with the voice input. The voice response may respond to the query with a response, which might be a spoken response played aloud by the networked microphone device via one or more speakers. As with conversations between two people, a relatively high signal-to-noise ratio may facilitate a voice service comprehending a voice input (i.e., being able to effectively parse the spoken words of the voice input into a command) and also a user comprehending a spoken response from a voice service over noise.

As noted above, various sources of sound may be considered noise relative to the voice input. For instance, when music is being played in a given environment while a voice input is spoken in that same environment, the music can be considered "noise" with respect to the voice input. Other sources of sound may generate ambient (e.g., background) noise while the voice input is spoken. Improving the signal-to-noise ratio of the voice input relative to these different sources of noise may improve comprehension of the voice input.

Improving the voice input-to-noise ratio may involve increasing the volume of the voice input or decreasing the volume of the noise, such that the volume of the voice input relative to the noise is increased. The human voice typically covers a broad frequency spectrum. However, only relatively narrow frequency bands are necessary to understand speech. The relatively narrow frequency bands include the fundamental frequencies (approximately 100 Hz for males and 180 Hz for females) and the frequencies just above. Therefore, a "good" voice input-to-noise ratio within those relatively narrow frequency bands is often sufficient for comprehension. This ratio does not necessarily need to be "good" across a broad frequency spectrum for the voice input to be comprehendible. These relatively narrow frequency bands can be referred to a speech bands.

Like the human voice, music typically covers a broad frequency spectrum. However, the relatively narrow frequency bands that drive speech comprehension are not as important to music consumption. Rhythm, timbre, and other compositional factors of music can be preserved when frequencies within the music that correspond to the speech bands are cut. As such, when music is being played while a voice input is spoken or a spoken response is played back, frequencies of the music corresponding to the speech bands can be ducked (i.e., temporality reduced in volume) to improve the relative volume of the voice input or spoken response within the speech bands to the music. This ducking may improve the signal-to-noise ratio without significantly compromising the music playback (the "noise").

One possible drawback to lowering the volume of the music within certain frequency ranges is that the perceived loudness of the music as a whole is reduced. However, an audio playback system may offset this reduction in perceived loudness by increasing the volume in other frequency bands (e.g., in all other frequencies outside the speech bands) while the volume of the music in the speech bands is being cut.

Another possible drawback to lowering the volume of the music within certain frequency ranges is that some of the lower-amplitude (relatively quiet) detail in the music may drop below the noise floor (e.g., the ambient noise). Similar to how speech can be difficult to understand over music and ambient noise, portions of the music might be difficult to understand over the noise floor (e.g., conversations between people, appliances, HVAC, outdoor noise such as traffic, among other possible sources). Losing low-amplitude fine detail in the music below the noise floor may impact enjoyment of the music.

In some implementations, the audio playback system may compress the music to bring the low-amplitude fine detail above the noise floor. The audio playback system may measure the ambient noise level, which relative to the music might include human speech. Then, the music may be compressed to increase the level of the low-amplitude fine detail above the noise floor. While compression might not preserve all detail, compressing the music may preserve some low-amplitude fine detail that would have been otherwise inaudible over the noise floor.

As noted above, speech may be difficult to comprehend in the presence of noise (e.g., music playback or other ambient noise). As such, some example techniques noted above may involve an audio playback system ducking music or other audio content to improve the signal-to-noise ratio of speech (e.g., voice inputs and spoken responses) relative to this noise, which may render the speech more comprehendible. More generally, music playback within an environment may make speech by two or more people attempting a conversation difficult to understand. In an attempt to alleviate this issue, an audio playback system may apply an equalization that improves the signal-to-noise (i.e., speech-to-music) ratio. This equalization may cut frequencies of music within the speech bands (i.e., the fundamental frequencies and those slightly above). The equalization may also boost frequencies outside the speech bands in an attempt to maintain the perceived loudness of the music when portions of the music within the speech bands are cut.

Since such an equalization changes the characteristics of the music being played back, some users may prefer that this equalization is not always applied. Rather, such users might prefer that the equalization is applied when speech is present. Speech within a given environment might include a conversation between two people in the environment, a telephone conversation between one person in the environment and other person somewhere else, speech from a voice-capable artificial intelligence (e.g. a spoken response from a voice service), among other examples. In some implementation, an audio playback system may include one or more microphones to detect speech. Alternatively, the audio playback system may use sensors to detect the number of people within the environment, which may indirectly indicate the presence of speech (i.e., the system may assume that the volume of speech within an environment increases with the number of possible speakers within that environment). When speech is detected, the audio playback system may apply the equalization to improve the signal-to-noise ratio of the speech to noise.

Example techniques may involve improving signal-to-noise ratio of speech to noise, such as music. A first implementation may include a playback device playing back first audio in a given environment at a given loudness, and while playing back the first audio: (a) detecting that an event is anticipated in the given environment, the event involving playback of second audio and (b) determining a loudness of background noise in the given environment, wherein the background noise comprises ambient noise in the given environment. The first implementation may further include ducking the first audio in proportion to a difference between the given loudness of the first audio and the determined loudness of the background noise. The first implementation may also include playing back the ducked first audio concurrently with the second audio.

A second implementation may include a playback device determining a loudness of first audio being played back by the playback device and a loudness of background noise in a given environment. The second implementation may also include determining whether a difference between a loudness of the first audio and a given dynamic range is (a) less than a determined loudness of the background noise or (b) greater than the determined loudness of the background noise. When the determined difference between the loudness of the ducked first audio and the given dynamic range is less than the determined loudness of the background noise, the second implementation may further include compressing the first audio to a dynamic range that is louder than the determined loudness of the background noise and playing back the compressed first audio. When the determined difference between the loudness of the first audio and the given dynamic range is greater than the determined loudness of the background noise, the second implementation may include playing back the first audio without compression.

A third implementation may involve a playback device playing audio content. While playing audio, the playback device may detect that a signal-to-noise ratio in the given environment is below a speech threshold. While the signal-to-noise ratio in the given environment is below a speech threshold, the playback device may apply an equalization to the audio content. The equalization may cut certain frequency bands corresponding to human speech. The equalization may also boost other frequency bands not corresponding to human speech.

Each of the these example implementations may be embodied as a method, a device configured to carry out the implementation, a system of devices configured to carry out the implementation, or a non-transitory computer-readable medium containing instructions that are executable by one or more processors to carry out the implementation, among other examples. It will be understood by one of ordinary skill in the art that this disclosure includes numerous other embodiments, including combinations of the example features described herein. Further, any example operation described as being performed by a given device to illustrate a technique may be performed by any suitable devices, including the devices described herein. Yet further, any device may cause another device to perform any of the operations described herein.

While some examples described herein may refer to functions performed by given actors such as "users" and/or other entities, it should be understood that this description is for purposes of explanation only. The claims should not be interpreted to require action by any such example actor unless explicitly required by the language of the claims themselves.

II. Example Operating Environment

FIG. 1 illustrates an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102, 104, 106, 108, 110, 112, 114, 116, 118, 120, 122, 124, control devices 126 and 128, a wired or wireless network router 130, and a networked microphone device 132.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
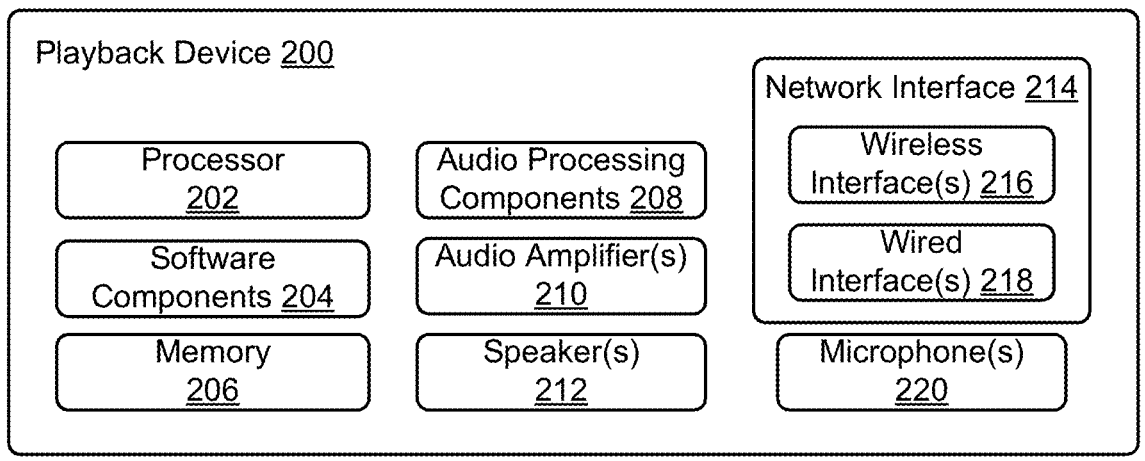
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
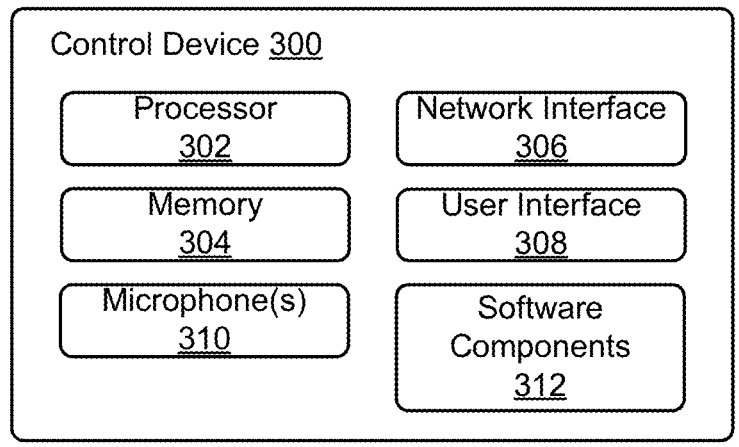
FIG. 3 shows a functional block diagram of an example control device.

FIG. 3 shows a functional block diagram of an example control device 300 that may be configured to be one or both of the control devices 126 and 128 of the media playback system 100. Control device 300 may also be referred to as a controller 300. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™ iPad™ or any other smart phone, tablet or network device (e.g., a networked computer such as a PC or Mac™)

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
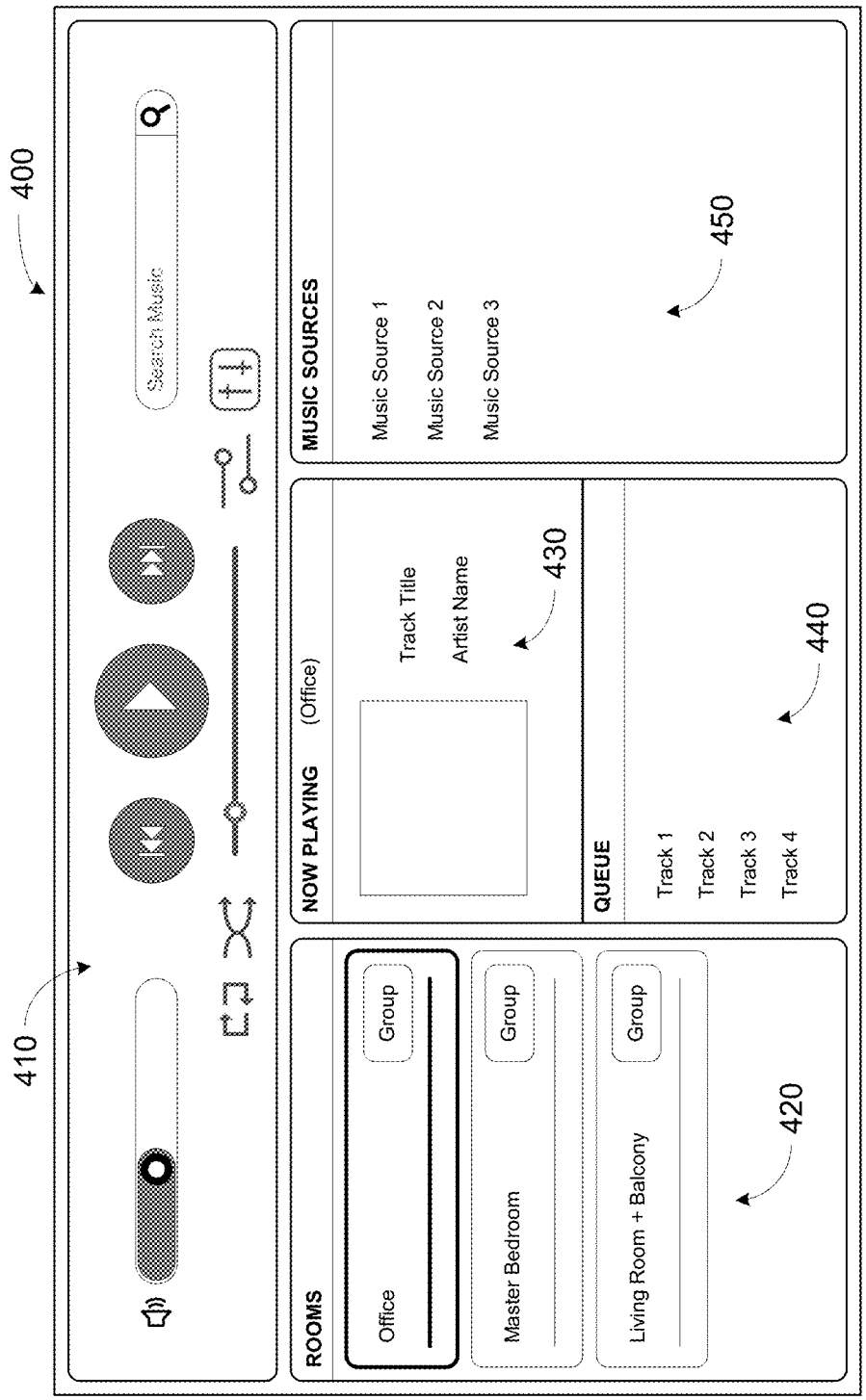
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device. Playback of such a playback queue may involve one or more playback devices playing back media items of the queue, perhaps in sequential or random order.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g., according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

e. Example Plurality of Networked Devices

Figure 5:
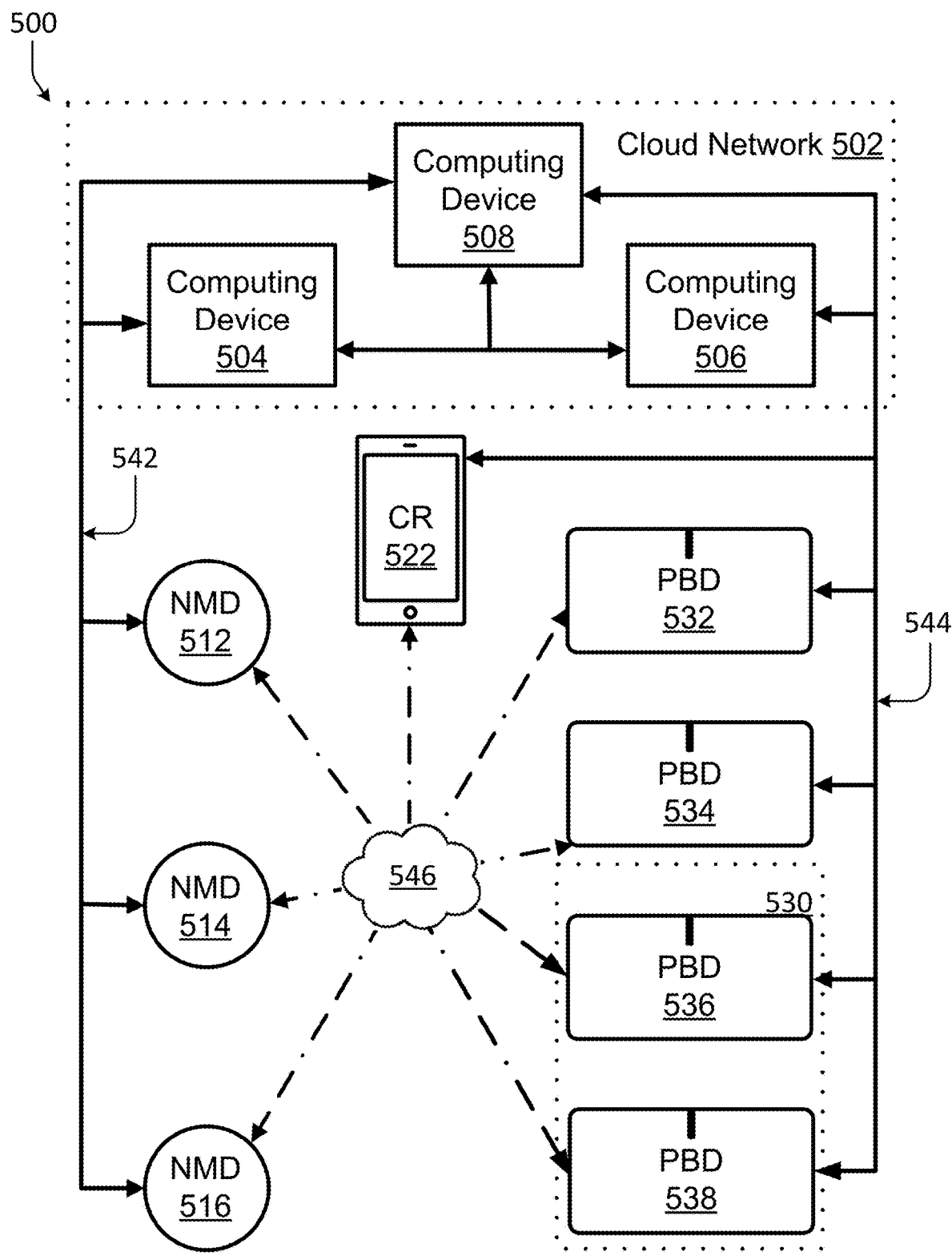
FIG. 5 shows an example plurality of network devices.

FIG. 5 shows an example plurality of devices 500 that may be configured to provide an audio playback experience based on voice control. One having ordinary skill in the art will appreciate that the devices shown in FIG. 5 are for illustrative purposes only, and variations including different and/or additional devices may be possible. As shown, the plurality of devices 500 includes computing devices 504, 506, and 508; network microphone devices (NMDs) 512, 514, and 516; playback devices (PBDs) 532, 534, 536, and 538; and a controller device (CR) 522.

Each of the plurality of devices 500 may be network-capable devices that can establish communication with one or more other devices in the plurality of devices according to one or more network protocols, such as NFC, Bluetooth, Ethernet, and IEEE 802.11, among other examples, over one or more types of networks, such as wide area networks (WAN), local area networks (LAN), and personal area networks (PAN), among other possibilities.

As shown, the computing devices 504, 506, and 508 may be part of a cloud network 502. The cloud network 502 may include additional computing devices. In one example, the computing devices 504, 506, and 508 may be different servers. In another example, two or more of the computing devices 504, 506, and 508 may be modules of a single server. Analogously, each of the computing device 504, 506, and 508 may include one or more modules or servers. For ease of illustration purposes herein, each of the computing devices 504, 506, and 508 may be configured to perform particular functions within the cloud network 502. For instance, computing device 508 may be a source of audio content for a streaming music service.

As shown, the computing device 504 may be configured to interface with NMDs 512, 514, and 516 via communication path 542. NMDs 512, 514, and 516 may be components of one or more "Smart Home" systems. In one case, NMDs 512, 514, and 516 may be physically distributed throughout a household, similar to the distribution of devices shown in FIG. 1. In another case, two or more of the NMDs 512, 514, and 516 may be physically positioned within relative close proximity of one another. Communication path 542 may comprise one or more types of networks, such as a WAN including the Internet, LAN, and/or PAN, among other possibilities.

In one example, one or more of the NMDs 512, 514, and 516 may be devices configured primarily for audio detection. In another example, one or more of the NMDs 512, 514, and 516 may be components of devices having various primary utilities. For instance, as discussed above in connection to FIGS. 2 and 3, one or more of NMDs 512, 514, and 516 may be the microphone(s) 220 of playback device 200 or the microphone(s) 310 of network device 300. Further, in some cases, one or more of NMDs 512, 514, and 516 may be the playback device 200 or network device 300. In an example, one or more of NMDs 512, 514, and/or 516 may include multiple microphones arranged in a microphone array.

As shown, the computing device 506 may be configured to interface with CR 522 and PBDs 532, 534, 536, and 538 via communication path 544. In one example, CR 522 may be a network device such as the network device 200 of FIG. 2. Accordingly, CR 522 may be configured to provide the controller interface 400 of FIG. 4. Similarly, PBDs 532, 534, 536, and 538 may be playback devices such as the playback device 300 of FIG. 3. As such, PBDs 532, 534, 536, and 538 may be physically distributed throughout a household as shown in FIG. 1. For illustration purposes, PBDs 536 and 538 may be part of a bonded zone 530, while PBDs 532 and 534 may be part of their own respective zones. As described above, the PBDs 532, 534, 536, and 538 may be dynamically bonded, grouped, unbonded, and ungrouped. Communication path 544 may comprise one or more types of networks, such as a WAN including the Internet, LAN, and/or PAN, among other possibilities.

In one example, as with NMDs 512, 514, and 516, CR 522 and PBDs 532, 534, 536, and 538 may also be components of one or more "Smart Home" systems. In one case, PBDs 532, 534, 536, and 538 may be distributed throughout the same household as the NMDs 512, 514, and 516. Further, as suggested above, one or more of PBDs 532, 534, 536, and 538 may be one or more of NMDs 512, 514, and 516.

The NMDs 512, 514, and 516 may be part of a local area network, and the communication path 542 may include an access point that links the local area network of the NMDs 512, 514, and 516 to the computing device 504 over a WAN (communication path not shown). Likewise, each of the NMDs 512, 514, and 516 may communicate with each other via such an access point.

Similarly, CR 522 and PBDs 532, 534, 536, and 538 may be part of a local area network and/or a local playback network as discussed in previous sections, and the communication path 544 may include an access point that links the local area network and/or local playback network of CR 522 and PBDs 532, 534, 536, and 538 to the computing device 506 over a WAN. As such, each of the CR 522 and PBDs 532, 534, 536, and 538 may also communicate with each over such an access point.

In one example, a single access point may include communication paths 542 and 544. In an example, each of the NMDs 512, 514, and 516, CR 522, and PBDs 532, 534, 536, and 538 may access the cloud network 502 via the same access point for a household.

As shown in FIG. 5, each of the NMDs 512, 514, and 516, CR 522, and PBDs 532, 534, 536, and 538 may also directly communicate with one or more of the other devices via communication means 546. Communication means 546 as described herein may involve one or more forms of communication between the devices, according to one or more network protocols, over one or more types of networks, and/or may involve communication via one or more other network devices. For instance, communication means 546 may include one or more of for example, Bluetooth™ (IEEE 802.15), NFC, Wireless direct, and/or Proprietary wireless, among other possibilities.

In one example, CR 522 may communicate with NMD 512 over Bluetooth™, and communicate with PBD 534 over another local area network. In another example, NMD 514 may communicate with CR 522 over another local area network, and communicate with PBD 536 over Bluetooth. In a further example, each of the PBDs 532, 534, 536, and 538 may communicate with each other according to a spanning tree protocol over a local playback network, while each communicating with CR 522 over a local area network, different from the local playback network. Other examples are also possible.

In some cases, communication means between the NMDs 512, 514, and 516, CR 522, and PBDs 532, 534, 536, and 538 may change depending on types of communication between the devices, network conditions, and/or latency demands. For instance, communication means 546 may be used when NMD 516 is first introduced to the household with the PBDs 532, 534, 536, and 538. In one case, the NMD 516 may transmit identification information corresponding to the NMD 516 to PBD 538 via NFC, and PBD 538 may in response, transmit local area network information to NMD 516 via NFC (or some other form of communication). However, once NMD 516 has been configured within the household, communication means between NMD 516 and PBD 538 may change. For instance, NMD 516 may subsequently communicate with PBD 538 via communication path 542, the cloud network 502, and communication path 544. In another example, the NMDs and PBDs may never communicate via local communications means 546. In a further example, the NMDs and PBDs may communicate primarily via local communications means 546. Other examples are also possible.

In an illustrative example, NMDs 512, 514, and 516 may be configured to receive voice inputs to control PBDs 532, 534, 536, and 538. The available control commands may include any media playback system controls previously discussed, such as playback volume control, playback transport controls, music source selection, and grouping, among other possibilities. In one instance, NMD 512 may receive a voice input to control one or more of the PBDs 532, 534, 536, and 538. In response to receiving the voice input, NMD 512 may transmit via communication path 542, the voice input to computing device 504 for processing. In one example, the computing device 504 may convert the voice input to an equivalent text command, and parse the text command to identify a command. Computing device 504 may then subsequently transmit the text command to the computing device 506. In another example, the computing device 504 may convert the voice input to an equivalent text command, and then subsequently transmit the text command to the computing device 506. The computing device 506 may then parse the text command to identify one or more playback commands.

For instance, if the text command is "Play 'Track 1' by 'Artist 1' from 'Streaming Service 1' in 'Zone 1'," The computing device 506 may identify (i) a URL for "Track 1" by "Artist 1" available from "Streaming Service 1," and (ii) at least one playback device in "Zone 1." In this example, the URL for "Track 1" by "Artist 1" from "Streaming Service 1" may be a URL pointing to computing device 508, and "Zone 1" may be the bonded zone 530. As such, upon identifying the URL and one or both of PBDs 536 and 538, the computing device 506 may transmit via communication path 544 to one or both of PBDs 536 and 538, the identified URL for playback. One or both of PBDs 536 and 538 may responsively retrieve audio content from the computing device 508 according to the received URL, and begin playing "Track 1" by "Artist 1" from "Streaming Service 1."

One having ordinary skill in the art will appreciate that the above is just one illustrative example, and that other implementations are also possible. In one case, operations performed by one or more of the plurality of devices 500, as described above, may be performed by one or more other devices in the plurality of device 500. For instance, the conversion from voice input to the text command may be alternatively, partially, or wholly performed by another device or devices, such as NMD 512, computing device 506, PBD 536, and/or PBD 538. Analogously, the identification of the URL may be alternatively, partially, or wholly performed by another device or devices, such as NMD 512, computing device 504, PBD 536, and/or PBD 538.

f. Example Network Microphone Device

Figure 6:
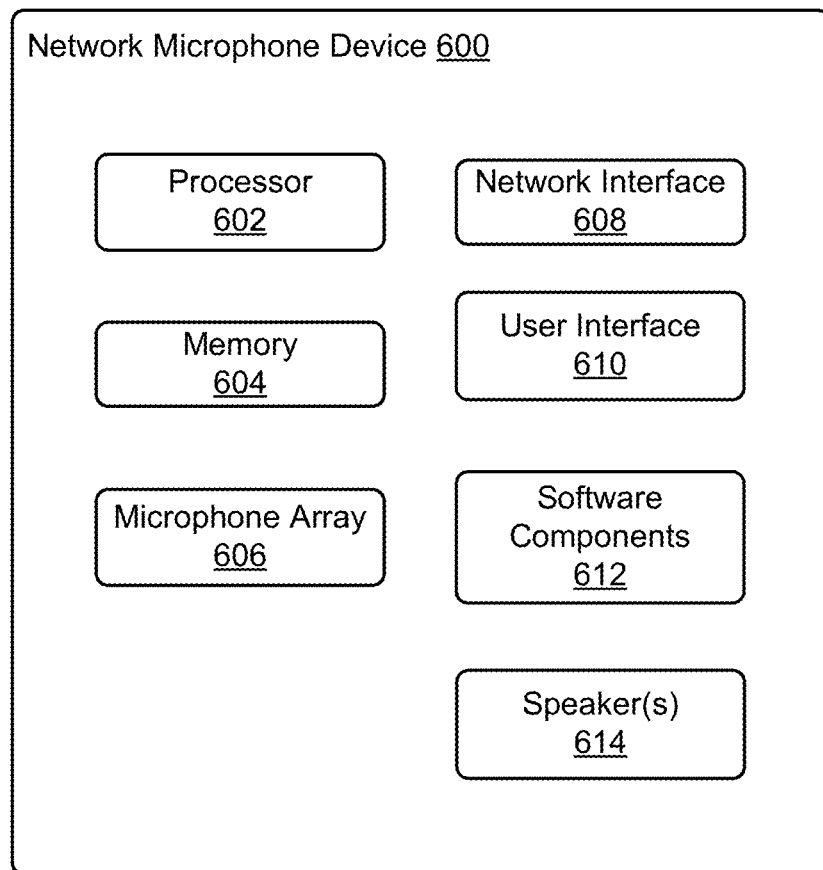
FIG. 6 shows a functional block diagram of an example network microphone device.

FIG. 6 shows a functional block diagram of an example network microphone device 600 that may be configured to be one or more of NMDs 512, 514, and 516 of FIG. 5. As shown, the network microphone device 600 includes a processor 602, memory 604, a microphone array 606, a network interface 608, a user interface 610, software components 612, and speaker(s) 614. One having ordinary skill in the art will appreciate that other network microphone device configurations and arrangements are also possible. For instance, network microphone devices may alternatively exclude the speaker(s) 614 or have a single microphone instead of microphone array 606.

The processor 602 may include one or more processors and/or controllers, which may take the form of a general or special-purpose processor or controller. For instance, the processing unit 602 may include microprocessors, microcontrollers, application-specific integrated circuits, digital signal processors, and the like. The memory 604 may be data storage that can be loaded with one or more of the software components executable by the processor 602 to perform those functions. Accordingly, memory 604 may comprise one or more non-transitory computer-readable storage mediums, examples of which may include volatile storage mediums such as random access memory, registers, cache, etc. and non-volatile storage mediums such as read-only memory, a hard-disk drive, a solid-state drive, flash memory, and/or an optical-storage device, among other possibilities.

The microphone array 606 may be a plurality of microphones arranged to detect sound in the environment of the network microphone device 600. Microphone array 606 may include any type of microphone now known or later developed such as a condenser microphone, electret condenser microphone, or a dynamic microphone, among other possibilities. In one example, the microphone array may be arranged to detect audio from one or more directions relative to the network microphone device. The microphone array 606 may be sensitive to a portion of a frequency range. In one example, a first subset of the microphone array 606 may be sensitive to a first frequency range, while a second subset of the microphone array may be sensitive to a second frequency range. The microphone array 606 may further be arranged to capture location information of an audio source (e.g., voice, audible sound) and/or to assist in filtering background noise. Notably, in some embodiments the microphone array may consist of only a single microphone, rather than a plurality of microphones.

The network interface 608 may be configured to facilitate wireless and/or wired communication between various network devices, such as, in reference to FIG. 5, CR 522, PBDs 532-538, computing device 504-508 in cloud network 502, and other network microphone devices, among other possibilities. As such, network interface 608 may take any suitable form for carrying out these functions, examples of which may include an Ethernet interface, a serial bus interface (e.g., FireWire, USB 2.0, etc.), a chipset and antenna adapted to facilitate wireless communication, and/or any other interface that provides for wired and/or wireless communication. In one example, the network interface 608 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on).

The user interface 610 of the network microphone device 600 may be configured to facilitate user interactions with the network microphone device. In one example, the user interface 608 may include one or more of physical buttons, graphical interfaces provided on touch sensitive screen(s) and/or surface(s), among other possibilities, for a user to directly provide input to the network microphone device 600. The user interface 610 may further include one or more of lights and the speaker(s) 614 to provide visual and/or audio feedback to a user. In one example, the network microphone device 600 may further be configured to playback audio content via the speaker(s) 614.

Figure 7:
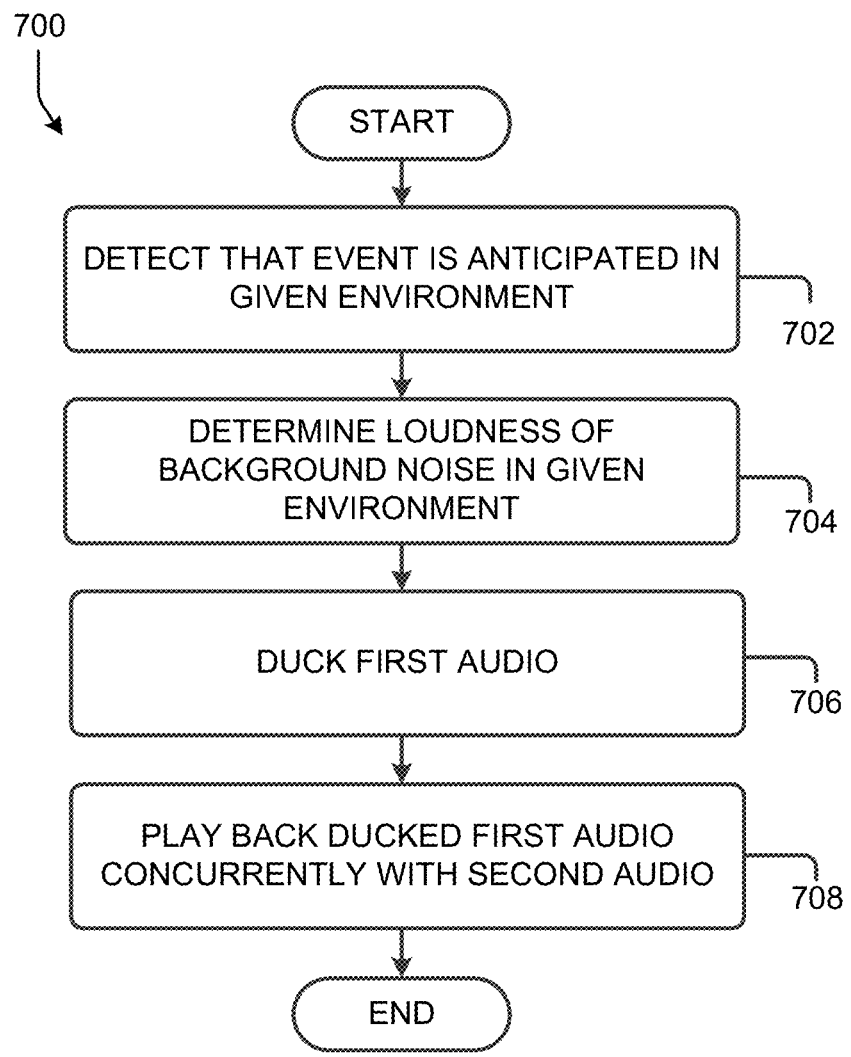
FIG. 7 shows a technique to duck audio, according to example implementations.
Figure 9:
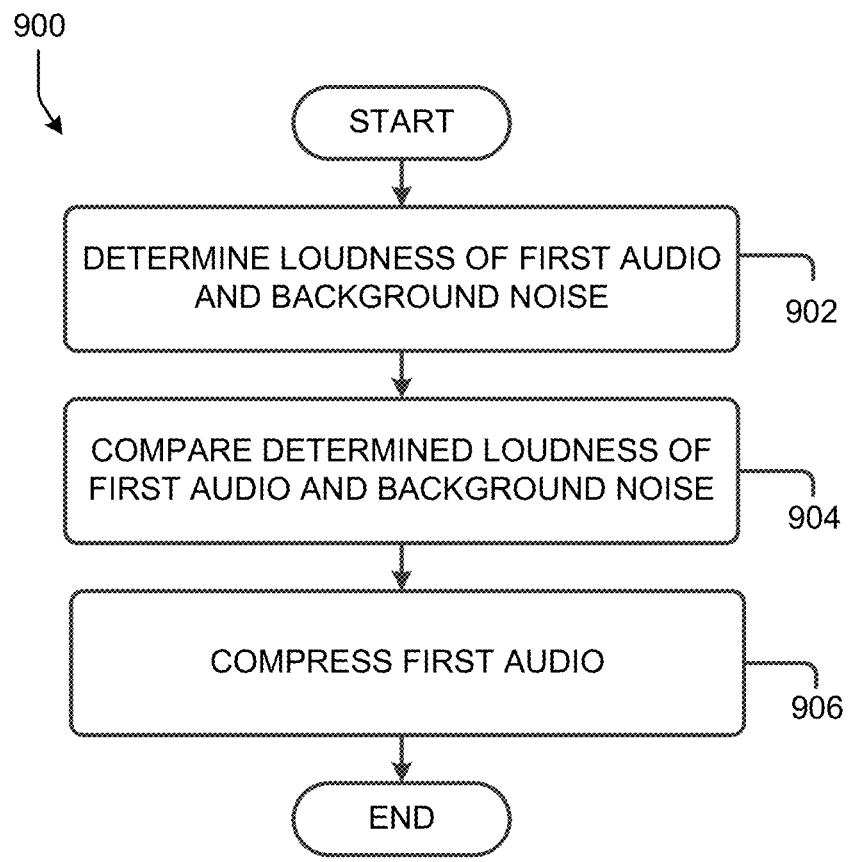
FIG. 9 shows a technique to compress audio, according to example implementations.
Figure 11:
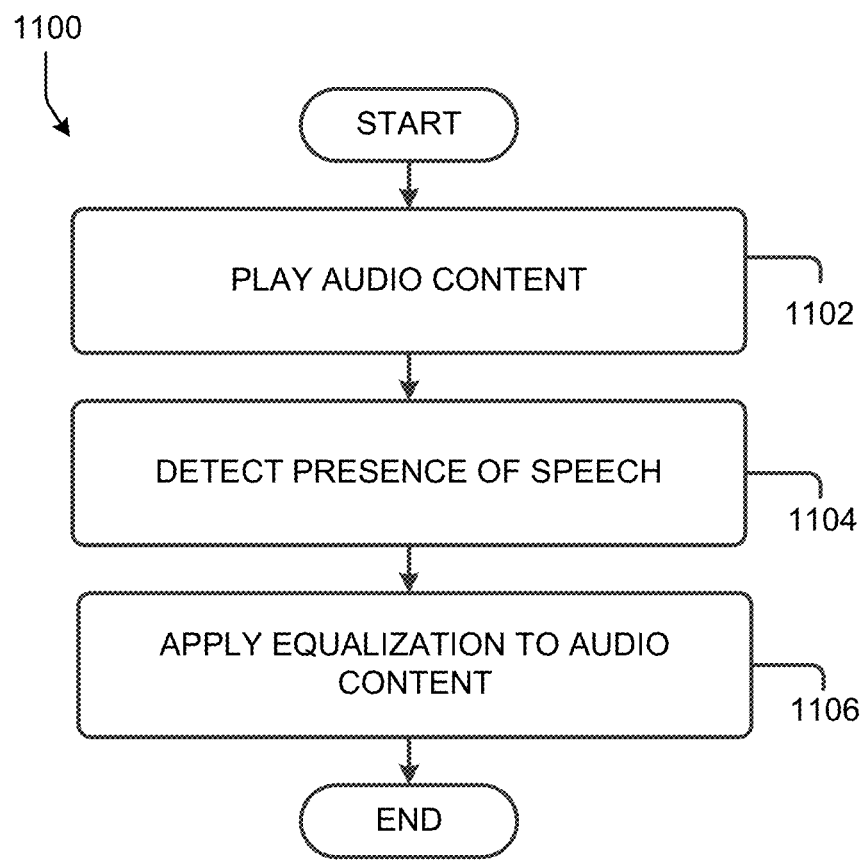
FIG. 11 shows a technique to equalize audio, according to example implementations.

Moving now to several example implementations, implementations 700, 900 and 1100 shown in FIGS. 7, 9, and 11, respectively present example embodiments of techniques described herein. These example embodiments that can be implemented within an operating environment including, for example, the media playback system 100 of FIG. 1, one or more of the playback device 200 of FIG. 2, or one or more of the control device 300 of FIG. 3, as well as other devices described herein and/or other suitable devices. Further, operations illustrated by way of example as being performed by a media playback system can be performed by any suitable device, such as a playback device or a control device of a media playback system. Implementations 700, 900, and 1100 may include one or more operations, functions, or actions as illustrated by one or more of blocks shown in FIGS. 7, 9, and 11. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the implementations disclosed herein, the flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the implementations disclosed herein, each block may represent circuitry that is wired to perform the specific logical functions in the process.

III. Example Techniques to Duck Audio

As discussed above, embodiments described herein may facilitate speech comprehension in the presence of noise, such as music playback. FIG. 7 illustrates an example implementation 700 by which a playback device ducks audio being played back. Such ducking may improve speech comprehension in the presence of the played back audio.

a. Detect that an Event is Anticipated in a Given Environment

At block 702, implementation 700 involves detecting that an event is anticipated in a given environment. For instance, a playback device, such as playback device 114 of media playback system 100, may detect that an event is anticipated in a given environment (e.g., within the example home environment or a subset of its rooms and spaces, such as in the Kitchen). Such an anticipated event may be an event that is expected or predicted to occur but has not yet taken place (or perhaps has not fully taken place). During the event (or a portion thereof), audio that is being played by one or more playback devices of a media playback system (e.g., any of playback devices 102-124 of media playback system 100) may be ducked. Ducking is an audio effect by which the level of one audio signal is reduced during the presence of another audio signal.

As noted above, audio that is being played back may be ducked. Implementation 700 may involve detecting that an event is anticipated while playing back first audio in the given environment. The first audio might be music, talk radio or other programming, television or home theater content, audio from an analog or digital line-in to the playback device, as well as other types of audio or a combination of multiple types of audio. Ultimately, the playback device may duck the first audio during the event (or during a portion of the event).

Some example events may involve playback of second audio. Detecting that such an event is anticipated may involve detecting that playback of the second audio is anticipated. A playback device may anticipate playback of second audio when the playback device receives an instruction to playback the second audio via a network interface (and/or receives the second audio itself for playback, perhaps as an audio stream). Alternatively, a first playback device (e.g., playback device 112) may detect that playback of the second audio by one or more second playback devices is anticipated, perhaps by receiving a transmission indicating that the one or more second playback devices (e.g., one or more of the playback devices of media playback system 100) are expected to play back second audio.

In some cases, the second audio may be related to a voice service. Some voice services include artificial intelligence to process voice inputs and generate responses to those voice inputs. For instance, the second audio may include a spoken voice input to a voice service (e.g., "Hey Kitchen, what is the weather today?"). The second audio may additionally or alternatively include a spoken response to a voice input (e.g., "The weather is clear and sunny with a high of 75 degrees and a low of 68 degrees"). The playback device may receive such a response via a network interface from a voice service or from an NMD, among other sources.

Detecting that an event is anticipated in a given environment may involve receiving an indication that a voice command with the given environment is anticipated. For instance, an NMD (e.g., NMD 132 of FIG. 1) may detect a voice input and transmit an indication to playback device 114 that second audio is anticipated. Detecting that an event is anticipated in the given environment may involve receiving that indication.

In some cases, a voice input may include a wake word and a voice command. Detection of a spoken wake-word (e.g., "Hey Siri," "Ok, Google," "Sonos," or "Hey, Alexa," among others) may cause a NMD to start listening for a voice command. As such, detection of a wake word may indicate that a voice command is expected in the given environment. A playback device may detect that an event (e.g., a voice command and/or an audio response to the voice command) is anticipated by receiving an indication from an NMD that a wake word was detected. Alternatively, an NMD may be integrated with a playback device. In such implementations, the playback device may detect that an event is anticipated by detecting a voice input via one or more microphones (e.g., a far-field microphone array). The voice input or a portion thereof (e.g., a wake-word) may cause the playback device to anticipate the event (e.g., second audio include a voice command and/or an audio response to the voice command).

The second audio might include other audio streams as well. Example streams include any stream from a cloud services (e.g., a stream from a home cloud service indicating that a "smart" device (e.g., an appliance or other smart home device with an processor and network interface) is experiencing a condition. For instance, "smart" thermostat may cause a various audio streams indicating respective conditions to be played back (e.g., "HVAC system cooling" or "HVAC system fault").

Other example streams may be sent from other network-connected devices within the environment. For instance, a "smart" doorbell may instruct the playback device to output a doorbell track (e.g., a chime) perhaps by streaming the doorbell track to the playback device. As another example, a "smart" refrigerator may stream a spoken message (e.g., a message indicating that certain food is past its expiration date). Detecting that an event is anticipated may involve receiving an instruction to play back such a stream, receiving the stream itself, or receiving an indication that another playback device is instructed to play back the stream, among other examples.

In some examples, detecting that an event is anticipated may involve detecting input data from one or more control interfaces (e.g., controller interface 400 displayed on a control device or a physical button on a playback device, among other options). The input data may indicate an instruction that causes the playback device to play back second audio. As noted above, the second audio may include a spoken response from a voice service, an audio stream from a "smart" device, or an audio stream from a cloud service, among other examples. For instance, a remote control may include a microphone button that causes the remote control to start listening for a voice input via one or more microphones. Detecting a press of such a button may cause the playback device to anticipate an event that involves second audio within the environment (e.g., a voice input and/or an audio response to that voice input).

As noted above, a playback device may detect that the event is anticipated while playing back first audio in the given environment. For instance, playback device 114 of media playback system 100 in FIG. 1 may stream first audio and play the streamed audio in the Kitchen. In some cases, the playback device may be part of a grouping of playback devices, such as a bonded zone or zone group. In such cases, playing back first audio in the given environment may involve playing audio in synchrony with other playback devices in the grouping. For instance, playback devices 104, 106, 108, and 110 may play back respective channels of first audio that includes surround sound (e.g., home theater) audio. As another example, playback devices 104, 106, 108, 110, 112 and 114 may be joined into a zone group to play music in synchrony. Many examples are possible.

b. Determine Loudness of Background Noise in Given Environment

Referring back to FIG. 7, at block 704, implementation 700 involves determining a loudness of background noise in the given environment. For instance, the playback device may measure background noise in the given environment using one or more microphones. Alternatively, the playback device may transmit a request that causes one or more NMDs to measure background noise in the given environment. The background noise may include ambient noise within the given environment (e.g., conversations between people, appliances, HVAC, outdoor noise such as traffic, among other possible sources). The playback device may determine loudness while playing back the first audio in the given environment.

In some cases, multiple NMDs may perform the measurement of background noise. For instance, the playback device may transmit to multiple NMDs respective requests to measure background noise. Alternatively, one or more first NMDs may receive an instruction to measure background noise and cause one or more second NMDs to measure background noise. The NMDs may measure the background noise using one or more microphones (e.g., using a far-field microphone array). For instance, NMD 132 and control devices 126 shown in Figure (which may have an integrated NMD) may each perform a measurement of background noise within the Living Room/Dining Room/Kitchen environment.

A suitable processing device, such as the playback device or an NMD, may combine multiple measurements of background noise to yield a representation of loudness of background noise in the given environment. In some cases, the processing device may average multiple measurements of background noise to determine the loudness. In some cases, measurements from respective NMDs may be weighted (e.g., prioritized) differently, perhaps based on the quality of measurement. Quality of measurement may vary based on an NMD's position within the given environment (which may influence how well the NMD is able to measure background noise), the quality of microphone(s) used to measure background noise, or other factors that might influence measurement quality.

In some implementations, the processing device may offset the first audio that the playback device is playing back within the measurement of background noise in the given environment. By offsetting the first audio from the measurement, the measurement may more accurately represent the ambient noise other than the first audio that is present within the environment.

Various techniques may be used to offset the first audio from the measurement. For instance, the measurement may use acoustic echo cancellation or beam-forming to offset the first audio from the measurement, among other suitable recording techniques. Alternatively, the acoustic response of the playback device and the first audio may each be known, such that the response produced by the playback device in playing back the first audio is known (to at least some approximate degree). With this response known, the processing device can offset the first audio from a measurement of background noise by subtraction. Other techniques are possible as well.

In some cases, the measurement device(s) and/or the processing device(s) may transmit measurement(s) of background noise to the playback device. This measurement may be represented as a decibel value of a known scale or an identifier of a range (e.g., a loudness-window) in which the loudness measurement falls, among any suitable indication of the measured loudness. In some cases, the transmission may represent an error state indicating that a loudness measurement could not be obtained.

As indicated above, in some cases, the playback device might not be able to obtain a loudness measurement. For instance, there might not be any suitable NMDs within the given environment to perform the measurement. Or, as another example, there may be a connection issue between NMDs within the given environment and the playback device. Other issues are possible as well.

When the playback device is unable to obtain a measurement of the background noise, the playback device may estimate the background noise. For instance, the playback device may estimate the background noise as some default background noise level. Alternatively, the playback device may estimate the background noise as the last known background noise level within the environment.

As yet another example, the playback device may estimate the background noise based on a measurement of background noise in another room. For example, playback device 114 may estimate background noise in the Living Room/Dining Room/Kitchen environment using a measurement of background noise in the Bedroom environment from control device 128. The estimate of background noise in the Living Room/Dining Room/Kitchen environment based the measurement of background noise in the Bedroom environment may be adjusted based on the relative locations of two environments and any obstructions between the two environments, which may be known. Emitting sound in one environment and recording that sound in another may facilitate mapping transforms between environments (e.g., between rooms or spaces).

c. Duck the First Audio

In FIG. 7, at block 706, implementation 700 involves ducking the first audio. For instance, the playback device may duck the first audio that is being played back by the playback device. As noted above, ducking is an audio effect by which the level of one audio signal is reduced during the presence of another audio signal. As used herein, ducking may refer to volume reduction of the first audio that the playback device is playing back during the anticipated event. For example, the playback device may reduce the volume of the first audio while the second audio is present (e.g., playing back or being spoken).

As noted above, in some instances, the anticipated event may involve second audio. The second audio may include a voice input and/or a spoken response from a voice service to a voice input. In some examples, the playback device ducks the first audio (e.g., one or more audio tracks, such as music) during the voice input and/or during the spoken response from the voice service. Such ducking may assist an NMD in comprehending the voice input and/or a user in comprehending a spoken response.

The amount of ducking (i.e., the amount of volume reduction of the first audio) may vary based on desired outcomes of the ducking. For instance, the loudness of the first audio may be reduced to the volume level of the second audio such that the first audio and the second audio are output at approximately equal loudness levels. Other examples are possible.

In some examples, the first audio may be ducked by a specific amount based on the difference between loudness of the first audio and the background noise. For instance, where the playback device is playing back the first audio at a given loudness, the playback device may duck the first audio in proportion to the difference between the given loudness and the determined loudness of the background noise. Ducking the first audio by such an amount may assist in keeping the ducked first audio above the noise floor.

To illustrate, in one example a party might be held in the Living Room/Dining Room/Kitchen area shown in FIG. 1. During the party, playback devices 104, 106, 108, 110, 112, and/or 114 may play back first audio (e.g., music) at a given volume level. Music played at that volume level may generate a dynamic range centered around a given loudness. The dynamic range of the first audio is the difference between the quiet and loudest parts of the first audio. Talking, dancing, and/or other actions by guests at the party may generate a relatively high level of background noise. Given this relatively loud background noise, if the first audio is set at a relatively low volume, some part of the first audio (i.e., the quiet parts of music at the low end of the dynamic range) may be below the noise floor. Alternatively, if the first audio is set at a relatively high volume, more (or all) of the first audio may be above the noise floor. When the first audio is ducked, the quieter parts of the first audio may go below the noise floor. Ducking the first audio in proportion to the difference between the given loudness and the determined loudness of the background noise may help to avoid portions of the first audio being lost under the noise floor.

Figure 8:
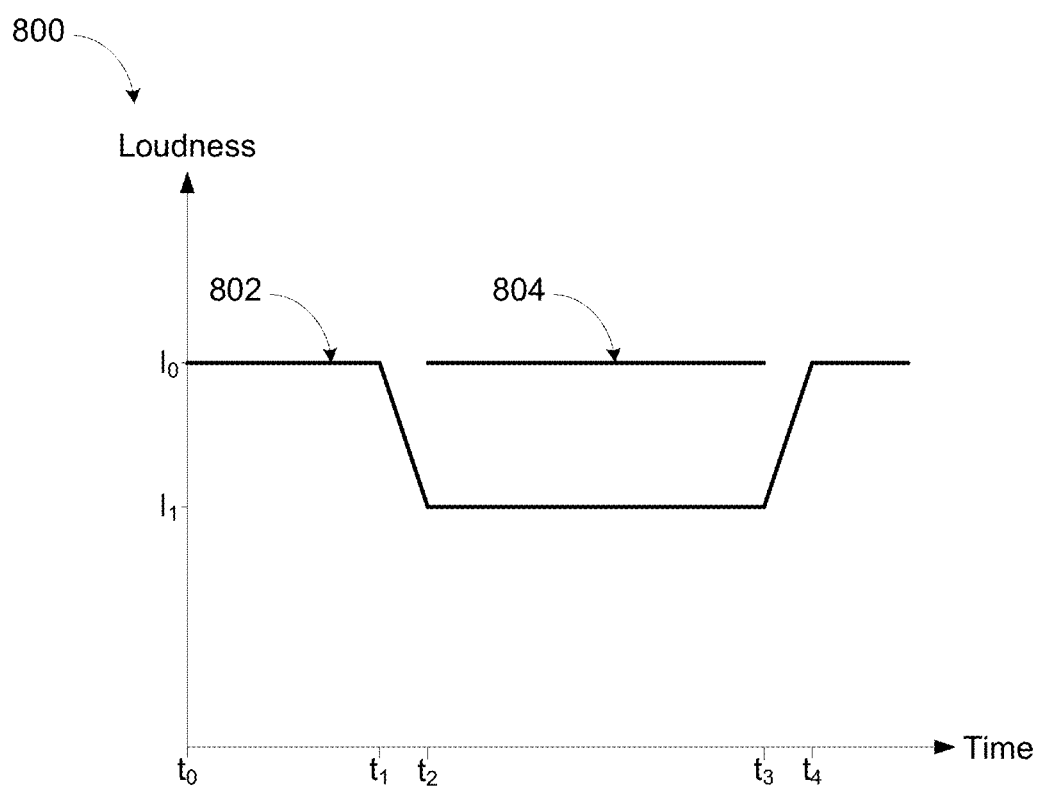
FIG. 8 shows a chart illustrating ducking of audio content.

As noted above, in some examples, the playback device may duck the first audio while the second audio is present. FIG. 8 includes a chart 800. In chart 800, time is plotted along the x-axis and loudness is plotted along the y-axis. At time $t_0$, a playback device is playing first audio 802 at loudness level $l_0$. From time $t_1$ to time $t_2$, the playback device reduces the loudness of first audio 802 from loudness level $l_0$ to loudness level $l_1$ so as to duck the first audio 802 in the presence of second audio 804.

In some cases, the playback device may duck the first audio itself. For instance, the playback device may adjust an amplifier level to reduce the volume of the first audio. Alternatively, the playback device may apply a filter to reduce the volume of the first audio. As yet another example, another device may process the first audio to reduce the volume of the first audio. Other examples are possible as well.

d. Play Back the Ducked First Audio Concurrently with the Second Audio

In FIG. 7, at block 708, implementation 700 involves playing back the ducked first audio concurrently with the second audio. For instance, the playback device may receive a stream of the second audio and play back that stream of second audio concurrently with the ducked first audio. As noted above, a playback device may receive a spoken response to a voice input from a voice service or intermediary device. The playback device may play back ducked music (e.g., one or more audio tracks) concurrently with the spoken response from a voice input. As another example, the playback device may play back a ducked streaming radio station concurrently with an alarm from a "smart" device such as a doorbell or refrigerator. In a further example, the second audio may be a phone call and the playback device may play back audio from the phone call concurrently with the ducked first audio. As noted above, many different types of first and second audio are contemplated.

As noted above, a playback device may be part of grouping of playback devices, such as a bonded zone or zone group. In such cases, the playback device may play the first audio in synchrony with other playback devices in the grouping. In some implementations, all of the playback devices in the grouping may play back the ducked first audio concurrently with the second audio. In other implementations, a subset of the playback devices in the grouping may play back the ducked first audio concurrently with the second audio, while the other playback devices continue to play back the first audio without ducking. In yet further examples, a subset of the playback devices in the grouping may play back the second audio while the other playback devices play back the first audio. Other examples are possible as well.

The playback device may continue to duck the first audio until the anticipated event has completed or until a future event occurs, among other examples. For instance, if the event is a voice interaction with a voice service, the playback device may duck the first audio while a user is speaking a voice input and/or while playing back a spoken response from the voice service. As another example, if the event is a phone call, the playback device may duck the first audio until the phone call ends (e.g., until the parties hang up). Generally, in examples where the second audio is an audio stream, the playback device may duck the first audio until the second audio completes play back.

To illustrate, referring back to FIG. 8, the second audio 804 is output from time $t_2$ to $t_3$. The first audio 802 is ducked from time $t_2$ until $t_3$. Time $t_3$ may correspond to the end of the anticipated event beginning at $t_2$ or to a future event detected by the playback device. From time $t_3$ to $t_4$, the ducking is reversed by raising the volume level from $l_1$ to $l_2$.

IV. Example Techniques to Compress Audio

As discussed above, embodiments described herein may facilitate compressing audio in the presence of second audio. FIG. 9 illustrates an example implementation 900 by which a playback device compresses first audio. The playback device may compress the first audio while ducking the first audio, as described above in connection with implementation 700.

a. Determine Loudness of First Audio and Background Noise

At block 902, implementation 900 involves determining a loudness of first audio and background noise in a given environment. For instance, a playback device may determine the loudness of first audio played back by the playback device (and possibly one or more additional playback devices in synchrony with the playback device). The first audio may be any suitable audio, such as any of the examples of first audio discussed above in connection with implementation 700, among other examples. The playback device may determine a loudness of background noise using any suitable technique, such as the example techniques described in connection with block 704 of implementation 700.

In some instances, the first audio may be ducked first audio, such as the ducked first audio discussed above in connection with implementation 700. Ducked first audio may refer to audio that has been temporarily reduced in volume based on the presence of second audio.

The playback device may determine the loudness of the first audio using any suitable technique. For instance, the playback device may have a known volume setting (perhaps reduced by a known amount through ducking). The playback device may have a known equalization. Furthermore, the playback device may have a known response in the given environment, perhaps via a calibration procedure. The first audio may have a known or assumed level (e.g., −6 dB from an average master). Given one or more of these known values, the playback device may estimate the loudness of the first audio.

b. Compare Determined Loudness of First Audio with Loudness of Background Noise In FIG. 9, at block 904, implementation 900 involves comparing the determined loudness of the first audio with the determined loudness of the background noise. For instance, a playback device may determine a difference between a loudness of first audio (possibly ducked first audio) and a given dynamic range. The playback device may further determine whether the difference between the loudness of the (ducked) first audio and the given dynamic range is less than or greater than the determined loudness of the background noise. The given dynamic range may be a desired dynamic range of the first audio (e.g., a dynamic range of music playback).

c. Compressing First Audio

In FIG. 9, at block 906, implementation 900 involves compressing the first audio. The playback device may compress the first audio when the determined difference between the loudness of the (ducked) first audio and the given dynamic range is less than the determined loudness of the background noise. This determination may indicate that a portion of the dynamic range of the first audio is below the noise floor created by the background noise. By compressing the first audio in such circumstances, some or all of the dynamic range of the first audio may be raised above the noise floor. When the determined difference between the loudness of the (ducked) first audio and the given dynamic range is greater than the determined loudness of the background noise, the playback might not apply compression since such compression might be unnecessarily reduce the dynamic range of the first audio.

The amount of compression may be a function of the difference between the determined loudness of the background noise and the given dynamic range. For instance, when the difference is relatively large such that the low end of the dynamic range is relatively further below the noise floor created by the background noise, then the playback device may compress the first audio more to bring more (or all) of the dynamic range above the noise floor. Conversely, when the difference is relatively small such that the low end of the dynamic range is just below the noise floor, the playback device might compress the dynamic range of the first audio relatively less.

Figure 10:
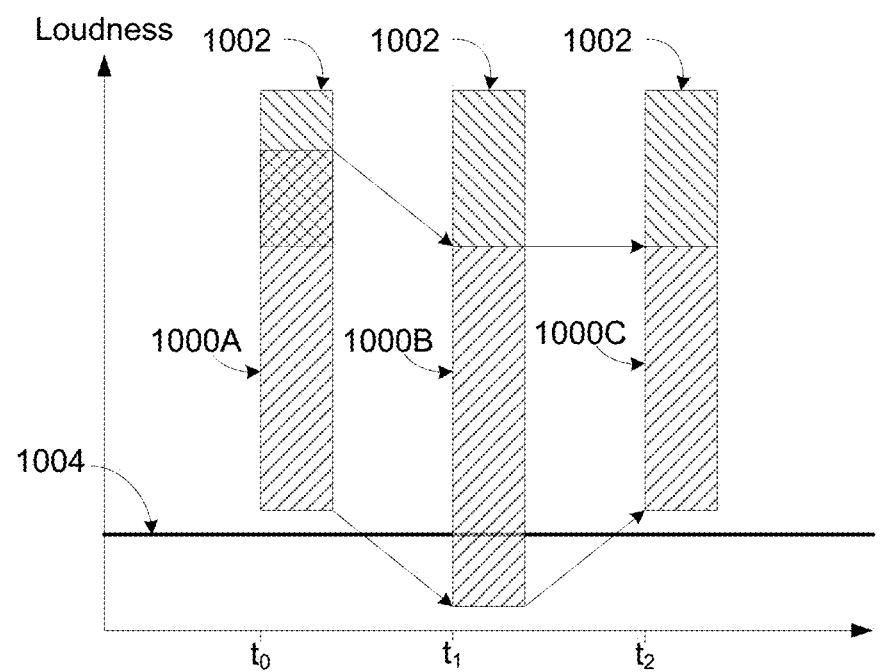
FIG. 10 is a diagram illustrating ducking and compression of audio content.

To illustrate, FIG. 10 is a diagram illustrating a dynamic range 1000A of first audio (e.g., music) and a dynamic range 1002A of second audio (e.g., voice). As shown, dynamic range 1000A and dynamic range 1002 overlap, which may make the first audio and/or the second audio hard to comprehend. At time $t_1$, the first audio is ducked, which causes a dynamic range 1000B of the ducked first audio to be below the dynamic range 1002 of the second audio. However, when ducked, the dynamic range of the first audio is below a noise floor 1004. In this case, quiet details in the first audio may be indiscernible over background noise. At time $t_2$, the ducked first audio is compressed, which causes a dynamic range 1000C of the ducked and compressed audio to be above the noise floor 1004. Although FIG. 10 describes ducking and compression as occurring in a particular order, these operations may be performed concurrently or in a different order.

Although examples techniques described in connection with implementation 1000 describe compression being applied based on a comparison between the determined loudness of background noise and the first audio, compression may be applied to the first audio under other conditions as well. For instance, compression may be applied based on content type (e.g., applied to music or talk radio) or background noise level, among other options. In some cases, compression is always applied to first audio when second audio is present.

V. Example Techniques to Apply Equalization

As discussed above, embodiments described herein may improve speech-to-noise ratio within a given environment. FIG. 11 illustrates an example implementation 1100 by which a playback device selectively applies an equalization to audio content being played back.

a. Play Audio Content in Given Environment

At block 1102, implementation 1100 involves playing audio content in a given environment. For instance, one or more playback devices (e.g., any combination of playback devices 102-124 in FIG. 1) may play back audio content in one or more rooms of the example home environment in FIG. 1. In one example, playback devices 112 and 114 may play back music in the Kitchen/Dining Room environment. The audio content may be music or any other suitable audio content.

b. Detect that a Signal-to-Noise Ratio in Given Environment is Below Speech Threshold In FIG. 11, at block 1104, implementation 1100 involves detecting that a signal-to-noise ratio in the given environment is below a speech threshold. For instance, a playback device (e.g., playback device 114 of FIG. 1) may determine that a signal-to-noise ratio in a given environment (i.e., the Kitchen or the combined Dining Room/Kitchen area) is below a speech threshold. A signal-to-noise ratio that is below the speech threshold may indicate that an improvement to signal-to-noise ratio in the given environment would facilitate comprehension of speech in that environment.

In some implementations, detecting that the signal-to-noise ratio in the given environment is below the speech threshold may involve detecting a number of people in the given environment. The playback device may assume that the signal-to-noise ratio in the given environment is below the speech threshold when there are more than a given number of people in the room (e.g., two or more). The playback device may detect a number of people in the environment by detecting signals from their respective smartphones or other devices using a network interface (e.g., using Bluetooth® beacons or WiFi® device detection). In another case, the playback device may detect sound pressure level of background noise in the given environment, perhaps by querying one or more NMDs for a measurement. A high sound pressure level of background noise may indicate that the signal-to-noise ratio in the given environment is below the speech threshold. In further implementations, user input may indicate a number of persons in the environment.

In other cases, the playback device may anticipate that speech will be present in the environment. For example, the playback device may receive an indication of a wake-word in the given environment, which may cause the playback device to anticipate a voice command. In other examples, the playback device may receive an audio stream representing speech to be played back by the playback device. Alternatively, the playback device may receive an indication that another playback device in the environment is outputting speech. The speech may be audio of a telephone call or a spoken response from a voice service, among other examples of human or computer-generated speech. When speech is present in the environment, the playback device may assume that the signal-to-noise ratio in the given environment is below the speech threshold.

c. Apply Equalization to Audio Content

In FIG. 11, at block 1106, implementation 1100 involves applying an equalization to the audio content. For instance, playback device 114 may filter the audio content (e.g., using one or more digital or analog filters) to a particular equalization. The equalization may cut the audio content at frequencies in the audio content corresponding to human speech (e.g., 150 Hz-3 kHz). Such filtering may include filtering at the fundamental frequencies of human speech (e.g., 100 Hz for males and 180 Hz for females). In some cases, the filtering may cut the audio content more at the fundamental frequencies of human speech. Filtering the audio content to reduce volume in frequencies corresponding to human speech may improve the speech-to-noise ratio in the given environment.

Filtering of frequencies in the audio content corresponding to human speech may reduce overall perceived loudness of the audio content. In some cases, the playback devices may offset this decrease in overall loudness by boosting frequencies above and/or below the frequencies in the audio content corresponding to human speech (e.g., bass and treble frequencies). In some cases, the playback device may use an equal loudness matching algorithm to boost frequencies by specific amounts to offset cutting of the frequencies in the audio content corresponding to human speech. Alternatively, overall gain of the audio content may be increased to offset the filtering of frequencies in the audio content corresponding to human speech.

The playback device may continue to filter the audio content while the signal-to-noise ratio in the given environment is below the speech threshold, among other examples. For instance, if the event is a voice interaction with a voice service, the playback device may filter the audio content while a user is speaking a voice input and/or while playing back a spoken response from the voice service. As another example, if the event is a phone call, the playback device may filter the audio content until the phone call ends (e.g., until the parties hang up). Other examples are possible as well.

VI. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

(Feature 1) A method comprising while playing back first audio in a given environment at a given loudness: (a) detecting that an event is anticipated in the given environment, wherein the event involves playback of second audio and (b) determining a loudness of background noise in the given environment, wherein the background noise comprises ambient noise in the given environment; ducking the first audio in proportion to a difference between the given loudness of the first audio and the determined loudness of the background noise; and playing back the ducked first audio concurrently with the second audio.

(Feature 2) The method of feature 1, wherein playing back the ducked first audio concurrently with the second audio comprises determining that a difference between a loudness of the ducked first audio and a given dynamic range is (a) less than the determined loudness of the background noise or (b) greater than the determined loudness of the background noise; when the determined difference between the loudness of the ducked first audio and the given dynamic range is less than the determined loudness of the background noise, compressing the first audio to a dynamic range that is louder than the determined loudness of the background noise and playing back the compressed first audio; and when the determined difference between the loudness of the ducked first audio and the given dynamic range is greater than the determined loudness of the background noise, playing back the first audio without compression.

(Feature 3) The method of feature 1, wherein detecting that the event is anticipated in the given environment comprises receiving an indication that a voice command within the given environment is anticipated.

(Feature 4) The method of feature 3, wherein receiving the indication that the voice command within the given environment is anticipated comprises detecting, via one or more microphones, a voice input comprising a wake-word.

(Feature 5) The method of feature 3, wherein the first audio comprises one or more audio tracks, wherein the second audio comprises a spoken response to the voice command received from a voice service, and wherein playing back the ducked first audio concurrently with the second audio comprises playing back the one or more audio tracks concurrently with the spoken response to the voice command.

(Feature 6) The method of feature 3, wherein playing back the ducked first audio concurrently with the second audio comprises detecting that a signal-to-noise ratio within the given environment is below a voice input threshold; and responsively, filtering the first audio, wherein filtering the first audio comprises cutting the first audio in a frequency range corresponding to human speech.

(Feature 7) The method of feature 1, wherein filtering the first audio further comprises boosting the first audio outside the frequency range corresponding to human speech.

(Feature 8) The method of feature 1, wherein the playback device is a first playback device of a group of playback device that includes one or more second playback devices, and wherein playing back the ducked first audio concurrently with the second audio comprises playing back the ducked first audio concurrently with the second audio in synchrony with the one or more second playback devices.

(Feature 9) The method of feature 1, wherein determining the loudness of background noise in the given environment comprises measuring the loudness of the background noise in the given environment via one or more microphone.

(Feature 10) The method of feature 9, wherein at least one of the one or more microphones is housed in a networked microphone device that is distinct from the playback device, and wherein measuring the loudness of the background noise in the given environment via one or more microphones comprises causing the networked microphone device to measure the loudness of the background noise in the given environment.

(Feature 11) The method of feature 9, wherein measuring the loudness of the background noise in the given environment comprises offsetting the first audio being played back by the playback device from the measurement of the background noise in the given environment.

(Feature 12) The method of feature 1, wherein the operations further comprise detecting that the event has completed, and wherein ducking the first audio comprises ducking the first audio until the event has completed.

(Feature 13) A tangible, non-transitory computer-readable medium having stored therein instructions executable by one or more processors to cause a device to perform the method of any of features 1-12.

(Feature 14) A playback device configured to perform the method of any of features 1-12.

(Feature 15) A media playback system configured to perform the method of any of features 1-12.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A playback device comprising:
a network interface;
one or more microphones;
an audio stage comprising an amplifier;
one or more speakers;
one or more processors;
a housing, the housing carrying at least the network interface, the one or more microphones, the audio stage, the one or more speakers, the one or more processors, and a computer-readable media having stored therein instructions executable by the one or more processors to cause the playback device to perform operations comprising:
while playing back first audio in a given environment at a given loudness via the audio stage and the one or more speakers:
(a) recording, via the one or more microphones, audio into a buffer;
(b) detecting, within the recorded audio, a wake word to invoke a voice assistant service;
(c) in response to detecting the wake word: (i) ducking the first audio while recording, into the buffer, audio representing a voice input to the voice assistant service and (ii) sending, via the network interface to one or more servers of the voice assistant service, the recorded audio in the buffer representing the voice input to the voice assistant service
(d) receiving, via the network interface from the one or more servers of the voice assistant service in response to the voice input, second audio representing a spoken response to the voice input; and
in response to receiving the second audio representing the spoken response to the voice input, ducking the first audio while playing back the ducked first audio concurrently with the second audio representing the spoken response to the voice input via the audio stage and the one or more speakers.

2. The playback device of claim 1, wherein ducking the first audio while recording audio representing the voice input to the voice assistant service comprises ducking the first audio to a first volume level, and wherein ducking the first audio while playing back the ducked first audio concurrently with the second audio representing the spoken response to the voice input comprises ducking the first audio to a second volume level that is different from the first level.

3. The playback device of claim 2, wherein the operations further comprise determining a loudness of background noise in the given environment, and wherein ducking the first audio to the second volume level that is different from the first level comprises ducking the first audio to a particular volume level that is based on the loudness of background noise in the given environment.

4. The playback device of claim 3, wherein ducking the first audio to the particular volume level that is based on the loudness of background noise in the given environment comprises ducking the first audio in proportion to a difference between the given loudness of the first audio and the determined loudness of the background noise.

5. The playback device of claim 3, wherein playing back the ducked first audio concurrently with the second audio comprises:
determining that a difference between a loudness of the ducked first audio and a given dynamic range is (a) less than the determined loudness of the background noise or (b) greater than the determined loudness of the background noise;
when the determined difference between the loudness of the ducked first audio and the given dynamic range is less than the determined loudness of the background noise, compressing the first audio to a dynamic range that is louder than the determined loudness of the background noise and playing back the compressed first audio; and when the determined difference between the loudness of the ducked first audio and the given dynamic range is greater than the determined loudness of the background noise, playing back the first audio without compression.

6. The playback device of claim 3, wherein determining the loudness of background noise in the given environment comprises measuring the loudness of the background noise in the given environment via one or more microphones.

7. The playback device of claim 6, wherein at least one of the one or more microphones is housed in a networked microphone device that is distinct from the playback device, and wherein measuring the loudness of the background noise in the given environment via one or more microphones comprises causing the networked microphone device to measure the loudness of the background noise in the given environment.

8. The playback device of claim 7, wherein measuring the loudness of the background noise in the given environment comprises offsetting the first audio being played back by the playback device from the measurement of the background noise in the given environment.

9. The playback device of claim 1, wherein playing back the ducked first audio concurrently with the second audio comprises:
    detecting that a signal-to-noise ratio within the given environment is below a voice input threshold; and
    responsively, filtering the first audio, wherein filtering the first audio comprises cutting the first audio in a frequency range corresponding to human speech.

10. The playback device of claim 9, wherein filtering the first audio further comprises boosting the first audio outside the frequency range corresponding to human speech.

11. The playback device of claim 1, wherein the playback device is a first playback device of a group of playback device that includes one or more second playback devices, and wherein playing back the ducked first audio concurrently with the second audio comprises playing back the ducked first audio concurrently with the second audio in synchrony with the one or more second playback devices.

12. The playback device of claim 1, wherein the operations further comprise detecting that the spoken response to the voice input has been played back, and wherein ducking the first audio comprises ducking the first audio until the spoken response to the voice input has been played back.

13. A tangible, non-transitory computer-readable medium having stored therein instructions executable by one or more processors to cause a playback device to perform a method, the playback device comprising a housing carrying at least a network interface, one or more microphones, an audio stage, one or more speakers, and the one or more processors, and the method comprising:
    while playing back first audio in a given environment at a given loudness via the audio stage and the one or more speakers:
        (a) recording, via the one or more microphones, audio into a buffer;
        (b) detecting, within the recorded audio, a wake word to invoke a voice assistant service;
        (c) in response to detecting the wake word: (i) ducking the first audio while recording, into the buffer, audio representing a voice input to the voice assistant service and (ii) sending, via the network interface to one or more servers of the voice assistant service, the recorded audio in the buffer representing the voice input to the voice assistant service
        (d) receiving, via the network interface from the one or more servers of the voice assistant service in response to the voice input, second audio representing a spoken response to the voice input; and
    in response to receiving the second audio representing the spoken response to the voice input, ducking the first audio while playing back the ducked first audio concurrently with the second audio representing the spoken response to the voice input via the audio stage and the one or more speakers.

14. The tangible, non-transitory computer-readable medium of claim 13, wherein ducking the first audio while recording audio representing the voice input to the voice assistant service comprises ducking the first audio to a first volume level, and wherein ducking the first audio while playing back the ducked first audio concurrently with the second audio representing the spoken response to the voice input comprises ducking the first audio to a second volume level that is different from the first level.

15. The tangible, non-transitory computer-readable medium of claim 14, wherein the method further comprises determining a loudness of background noise in the given environment, and wherein ducking the first audio to the second volume level that is different from the first level comprises ducking the first audio to a particular volume level that is based on the loudness of background noise in the given environment.

16. The tangible, non-transitory computer-readable medium of claim 15, wherein ducking the first audio to the particular volume level that is based on the loudness of background noise in the given environment comprises ducking the first audio in proportion to a difference between the given loudness of the first audio and the determined loudness of the background noise.

17. The tangible, non-transitory computer-readable medium of claim 15, wherein playing back the ducked first audio concurrently with the second audio comprises:
    determining that a difference between a loudness of the ducked first audio and a given dynamic range is (a) less than the determined loudness of the background noise or (b) greater than the determined loudness of the background noise;
    when the determined difference between the loudness of the ducked first audio and the given dynamic range is less than the determined loudness of the background noise, compressing the first audio to a dynamic range that is louder than the determined loudness of the background noise and playing back the compressed first audio; and
    when the determined difference between the loudness of the ducked first audio and the given dynamic range is greater than the determined loudness of the background noise, playing back the first audio without compression.

18. A method to be performed by a playback device comprising a housing carrying at least a network interface, one or more microphones, an audio stage, one or more speakers, the method comprising:
    while playing back first audio in a given environment at a given loudness via the audio stage and the one or more speakers:
        (a) recording, via the one or more microphones, audio into a buffer;
        (b) detecting, within the recorded audio, a wake word to invoke a voice assistant service;
        (c) in response to detecting the wake word: (i) ducking the first audio while recording, into the buffer, audio representing a voice input to the voice assistant service and (ii) sending, via the network interface to one or more servers of the voice assistant service, the recorded audio in the buffer representing the voice input to the voice assistant service (d) receiving, via the network interface from the one or more servers of the voice assistant service in response to the voice input, second audio representing a spoken response to the voice input; and in response to receiving the second audio representing the spoken response to the voice input, ducking the first audio while playing back the ducked first audio concurrently with the second audio representing the spoken response to the voice input via the audio stage and the one or more speakers.

19. The method of claim 18, wherein ducking the first audio while recording audio representing the voice input to the voice assistant service comprises ducking the first audio to a first volume level, and wherein ducking the first audio while playing back the ducked first audio concurrently with the second audio representing the spoken response to the voice input comprises ducking the first audio to a second volume level that is different from the first level.

20. The method of claim 19, wherein the method further comprises determining a loudness of background noise in the given environment, and wherein ducking the first audio to the second volume level that is different from the first level comprises ducking the first audio comprises ducking the first audio in proportion to a difference between the given loudness of the first audio and the determined loudness of the background noise.

* * * * *